United States Patent
Hiyoshi et al.

(10) Patent No.: US 7,684,061 B2
(45) Date of Patent: Mar. 23, 2010

(54) ELECTRONIC COMPONENT MOUNTING APPARATUS, HEIGHT DETECTION METHOD FOR ELECTRONIC COMPONENT, AND OPTICAL-AXIS ADJUSTMENT METHOD FOR COMPONENT HEIGHT DETECTION UNIT

(75) Inventors: Masanori Hiyoshi, Fukuoka (JP); Hidehiro Saho, Saga (JP); Noboru Yamasaki, Fukuoka (JP); Tadashi Endo, Fukuoka (JP)

(73) Assignee: Panasonic Corporation, Osaka (JP)

( * ) Notice: Subject to any disclaimer, the term of this patent is extended or adjusted under 35 U.S.C. 154(b) by 274 days.

(21) Appl. No.: 11/994,618

(22) PCT Filed: Jun. 29, 2006

(86) PCT No.: PCT/JP2006/313441
§ 371 (c)(1),
(2), (4) Date: Jan. 3, 2008

(87) PCT Pub. No.: WO2007/007623
PCT Pub. Date: Jan. 18, 2007

(65) Prior Publication Data
US 2009/0225304 A1    Sep. 10, 2009

(30) Foreign Application Priority Data
Jul. 8, 2005    (JP)    ............................ 2005-199876
Aug. 26, 2005    (JP)    ............................ 2005-245643
Aug. 30, 2005    (JP)    ............................ 2005-248976

(51) Int. Cl.
*G01B 11/06* (2006.01)
*G01B 11/02* (2006.01)

(52) U.S. Cl. ....................................... 356/634; 356/638

(58) Field of Classification Search ......... 356/634–638, 356/601–613
See application file for complete search history.

(56) References Cited

U.S. PATENT DOCUMENTS 5,897,611 A * 4/1999 Case et al. .................. 702/150

(Continued)

FOREIGN PATENT DOCUMENTS

EP    0 597 447    5/1994

(Continued)

OTHER PUBLICATIONS

International Search Report issued Jan. 23, 3007 in the International (PCT) Application of which the present application is the U.S. National Stage.

(Continued)

*Primary Examiner*—Michael P Stafira
(74) *Attorney, Agent, or Firm*—Wenderoth, Lind & Ponack, L.L.P.

(57) ABSTRACT

An electronic component mounting apparatus includes a beam projector for projecting a laser beam, a beam receiver which is placed in opposition to the beam projector and which receives a laser beam projected from the beam projector, a light-reception-sensitivity setting unit for adjusting light-reception sensitivity of the beam receiver, a projection-side orifice provided in the beam projector to narrow a projection spot diameter of the laser beam, and a reception-side orifice provided in the beam receiver to narrow a light-reception spot diameter, where the light-reception sensitivity of the beam receiver is improved. As a result, an electronic component mounting apparatus capable of accurately detecting height size of small components by using a relatively inexpensive photoelectric sensor can be provided.

11 Claims, 15 Drawing Sheets

U.S. PATENT DOCUMENTS 7,614,144 B2 * 11/2009 Ota et al. .................. 29/833

FOREIGN PATENT DOCUMENTS

| JP | 11-298196 | 10/1999 |
|---|---|---|
| WO | 03/026375 | 3/2003 |

OTHER PUBLICATIONS

PCT Written Opinion of the International Searching Authority, issued Jan. 23, 2007.

Patent Cooperation Treaty (PCT) International Preliminary Report on Patentability, issued Jan. 10, 2008.

* cited by examiner

ELECTRONIC COMPONENT MOUNTING APPARATUS, HEIGHT DETECTION METHOD FOR ELECTRONIC COMPONENT, AND OPTICAL-AXIS ADJUSTMENT METHOD FOR COMPONENT HEIGHT DETECTION UNIT

TECHNICAL FIELD

The present invention relates to an electronic component mounting apparatus for picking up an electronic component from an electronic component feed unit by a component holding member and mounting the electronic component onto a board or other mounting object. In particular, the present invention relates to an electronic component mounting apparatus including a component height detection unit for detecting a height or thickness dimension of an electronic component held by a component holding member.

BACKGROUND ART

In the field of electronic component mounting that electronic components are picked up from an electronic component feed unit by a nozzle, that is a component holding member, and mounted onto a board or other mounting object, it is practiced to measure the height size of the electronic component picked up by the nozzle for accurate mounting of the electronic component onto the board or other mounting object. The measured height size of the electronic component is fed back to nozzle height positioning control involved in mounting operation, and further collated with size data of the electronic component for judgment of a suck-up posture of the electronic component, by which any abnormal suckup which means that the electronic component is sucked up in a posture other than that with its mounting surface facing downward or the like is detected. As a result, mounting failures that the electronic component is mounted in an unstable state on the board or the like is prevented.

As the means for measuring the height size of an electronic component, one using a photoelectric sensor is known (see, e.g., Document 1: Japanese unexamined patent publication No. H11-298196 A). In this case, the height of an electronic component is measured through the steps of moving down the nozzle so that a laser beam projected from a separately placed beam projector to a beam receiver is orthogonally intersected by the nozzle, detecting nozzle height positions resulting at time points when the nozzle body and the electronic component picked up by the nozzle pass through the optical axis, respectively, and calculating the height of the electronic component from a difference between the nozzle height positions.

DISCLOSURE OF INVENTION

In such a photoelectric sensor, the projected-light spot diameter of a laser beam projected from the projector and the received-light spot diameter of a laser beam received by the beam receiver are, generally, about 1.0 to 1.2 mm. In recent years, as electronic equipment has been increasingly progressing toward smaller sizes and lighter weights, so electronic components to be mounted on electronic equipment have also been going smaller-sized. Thus, there is a demand that such small components as 0402-chips are sucked to the nozzle and accurately mounted onto a board or the like.

However, such small components as the 0402-chips have longitudinal, lateral and thickness sizes of about 0.2 to 0.4 mm, being quite small as compared with the spot diameter of conventional photoelectric sensors. Therefore, changes in received light quantity that decreases due to light interception by the small component are only minute ones, making it possible difficult to accurately detect a change in the received light quantity. Also, since light diffracted at end portions of a small component is received by the beam receiver, it is impossible to accurately detect a time point when the laser beam is intercepted by the small component, posing a problem that the height size of such a small component cannot be accurately detected in some cases. It is noted that although using a line sensor including a CCD camera enables a comparatively accurate detection of such small components, yet the line sensor is much higher in price than photoelectric sensors, being disadvantageous in terms of cost.

In the conventional method for detecting height size of electronic components as described in the Document 1, the detection of nozzle height is implemented by the detection of an encoder value of a drive unit for driving up and down motions of the nozzle. The encoder value is detected upon reception of electric signals issued when the received light quantity of the beam receiver has reached a certain threshold value. Therefore, increasing the up/down speed of the nozzle causes occurrence of a noticeable response delay, with the result that the detected encoder value is shifted by the response delay from a true encoder value resulting at the time point when the received light quantity of the beam receiver has reached the certain threshold value.

Such a shift of the encoder value due to response delay could be corrected to some extent by applying a preset corrected value. However, the shift amount of the encoder value varies depending on such conditions as the down-motion speed of the nozzle and the height of the picked-up electronic component, so that it is difficult to accurately set a corrected value corresponding to the individual conditions. Moreover, electronic components that fall outside the conditions are unmanageable with preset corrected values. Meanwhile, with recent years' trends toward further improvement of productivity and miniaturization of components, there is a growing demand for higher-speed, high-accuracy detection of nozzle height, i.e., detection of height size of electronic components.

In the photoelectric sensor described in Document 1 also, there are some cases where incorrect adjustment of the optical axis between the beam projector and the beam receiver causes a disturbance of the correlation between variation of nozzle height and variation of received light quantity, making it impossible to measure an accurate height of the electronic component. In particular, for measurement of recent years' miniaturized electronic components, it is necessary to clarify changes in received light quantity correlative to the nozzle height by proper adjustment of the optical axis.

Accordingly, an object of the present invention, lying in solving these and other issues, is to provide an electronic component mounting apparatus, a height detection method for electronic component and an optical-axis adjustment method for component height detection units each capable of accurately detecting height size of electronic components, which are to be mounted in the electronic component mounting apparatus, particularly height size of miniaturized electronic components, with use of a relatively inexpensive component height detection unit.

In order to achieve the above object, the present invention has the following constitutions.

According to a first aspect of the present invention, there is provided an electronic component mounting apparatus for mounting an electronic component picked up by a component holding member from an electronic component feed unit onto a mounting object, comprising:

a component height detection unit for detecting a height size of the electronic component held by the component holding member, the component height detection unit comprising:

a beam projector for projecting a light beam along an optical axis;

a beam receiver which is placed on the optical axis of the beam projector in opposition to the beam projector, for receiving the light beam projected from the beam projector;

a projection-side orifice provided in the beam projector, for partly intercepting the light beam projected from the beam projector so that a projection spot diameter of the light beam is narrowed;

a reception-side orifice provided in the beam receiver, for partly intercepting the light beam projected from the beam projector so that a reception spot diameter of the light beam received by the beam receiver is narrowed; and a light-reception-sensitivity setting unit for enhancing light-reception sensitivity of the beam receiver so as to compensate a quantity of light interception by the reception-side orifice in the beam receiver, wherein the electronic component held by the component holding member is placed on the optical axis between the beam projector and the beam receiver in the component height detection unit, a decrease of received light quantity of the light beam received by the beam receiver is detected by the component height detection unit, by which the height size of the electronic component is detected, and then based on the height size, the electronic component is mounted onto the mounting object.

According to a second aspect of the present invention, there is provided the electronic component mounting apparatus as defined in the first aspect, wherein the light-reception-sensitivity setting unit sets an enhanced light-reception sensitivity for the beam receiver so that a received light quantity of the beam receiver is substantially enhanced to a light quantity before the interception by the reception-side orifice.

According to a third aspect of the present invention, there is provided the electronic component mounting apparatus as defined in the first aspect, further comprising:

a detection-device control unit for detecting that the received light quantity of the light beam received by the beam receiver has reached a light-decrease detection value to thereby detect the light decrease;

an up/down drive unit for driving up and down moves of the component holding member; and a drive control unit for detecting an up/down height position of the component holding member moved-up or -down by the up/down drive unit, wherein the height position of the component holding member is acquired by the drive control unit at a time point when the light decrease is detected by the detection-device control unit, and the height size of the electronic component is calculated based on the acquired height position.

According to a fourth aspect of the present invention, there is provided the electronic component mounting apparatus as defined in the third aspect, wherein in the component height detection unit, a height size of the electronic component is calculated by a difference between the height position of the component holding member at which the light decrease is detected by the component holding member having no electronic component held thereon and the height position of the component holding member at which the light decrease is detected by the component holding member having the electronic component held thereon.

According to a fifth aspect of the present invention, there is provided the electronic component mounting apparatus as defined in the first aspect, wherein a hole diameter of the reception-side orifice is smaller than the height size of the electronic component.

According to a sixth aspect of the present invention, there is provided the electronic component mounting apparatus as defined in the first aspect, wherein a hole diameter of the projection-side orifice is larger than a hole diameter of the reception-side orifice.

According to a seventh aspect of the present invention, there is provided the electronic component mounting apparatus as defined in the first aspect, wherein the light-reception-sensitivity setting unit comprises at least an operational amplifier and a plurality of variable resistors, and the light-reception sensitivity of the beam receiver is improved and set by changing resistance values of the variable resistors.

According to an eighth aspect of the present invention, there is provided the electronic component mounting apparatus as defined in the first aspect, further comprising:

an up/down drive unit for driving up and down moves of the component holding member; and detection means for, during the up/down motions of the component holding member by the up/down drive unit, detecting first height positions of the component holding member in an up motion and a down motion of the component holding member, respectively, the first height positions being height positions of the component holding member resulting at time points when a lower end portion of the component holding member intersects the light beam so that received light quantity of the beam receiver reaches a light-decrease detection value, and detecting second height positions of the component holding member in up and down motions of the component holding member, respectively the second height positions being height positions of the component holding member resulting at time points when the electronic component held at the lower end portion of the component holding member intersects the light beam so that received light quantity of the beam receiver reaches the light-decrease detection value;

first calculation means for calculating an average value from the first height positions in the up and down motions of the component holding member and calculating an average value from the second height positions in the up and down motions; and second calculation means for calculating the height size of the electronic component based on a difference between the average value of the first height positions and the average value of the second height positions calculated by the first calculation means.

According to a ninth aspect of the present invention, there is provided a method for detecting a height size of an electronic component by using the electronic component mounting apparatus as defined in the first aspect, comprising:

a first detection step for, while moving down the component holding member, detecting, as a first height position of a down motion, a height position of the component holding member resulting at a time point when received light quantity of the beam receiver reaches a light-decrease detection value in a state that a lower end portion of the component holding member intersects the light beam;

a second detection step for, while moving up the component holding member, detecting, as a first height position of an up motion, a height position of the component holding member resulting at a time point when received light quantity of the beam receiver reaches the light-decrease detection value in a state that the lower end portion of the component holding member intersects the light beam;

a first calculation step for calculating an average value of the first height positions from the first height position of the down motion and the first height position of the up motion;

a third detection step for, while moving down the component holding member with the electronic component held on the lower end portion, detecting, as a second height position of a down motion, a height position of the component holding member resulting at a time point when received light quantity of the beam receiver reaches the light-decrease detection value in a state that the electronic component intersects the light beam;

a fourth detection step for, while moving up the component holding member with the electronic component held thereon, detecting, as a second height position of an up motion, a height position of the component holding member resulting at a time point when received light quantity of the beam receiver reaches the light-decrease detection value in a state that the electronic component intersects the light beam;

a second calculation step for calculating an average value of the second height positions from the second height position of the down motion and the second height position of the up motion; and a third calculation step for calculating a height size of the electronic component based on the average value of the first height positions and the average value of the second height positions.

According to a tenth aspect of the present invention, there is provided a method for adjusting an is optical axis between the beam projector and the beam receiver in the component height detection unit in the electronic component mounting apparatus as defined in the first aspect, comprising:

placing an optical filter on the optical axis between the projection-side orifice of the beam projector and the reception-side orifice of the beam receiver; and adjusting a relative position between the beam projector and the beam receiver, thereby making an optical-axis adjustment, while the light beam projected from the beam projector is received by the beam receiver in a state that received light quantity of the light beam has been decreased through the optical filter.

According to an eleventh aspect of the present invention, there is provided the method for adjusting an optical axis in the component height detection unit as defined in the tenth aspect, wherein the placement of the optical filter is implemented by placing on the optical axis an optical filter which has such a transmittancy that a received light quantity of the beam receiver in a perfect light-reception state with the optical filter provided becomes lower in value than a received light quantity of the beam receiver in a saturation state with no optical filter provided.

According to the present invention, by the inclusion of a projection-side orifice that narrows the projection spot diameter and a reception-side orifice that narrows the light-reception spot diameter, influences of diffraction of a light beam, e.g. laser beam, can be reduced. Furthermore, by the inclusion of a light-reception-sensitivity setting unit, such as an amplification unit for setting light-reception sensitivity in the beam receiver to an enhanced state as compared with cases in which those orifices are not provided, changes in the received light quantity due to interception of the light beam by an electronic component or a component holding member can be detected clearly. Thus, even if the electronic component is a small component, the component height can be accurately detected, so that the mounting accuracy for electronic components in the electronic component mounting apparatus can be improved.

Further, any height position detection error due to response delay in the component height detection unit is eliminated by taking average values of height positions of the component holding member detected in down and up motions of the component holding member. Thus, the height of the electronic component can be accurately measured.

Furthermore, since the received light quantity is decreased with interposition of an optical filter in the optical-axis adjustment of the component height detection unit, it becomes practicable to carry out the optical-axis adjustment as the light-reception sensitivity is kept improved. Further, since decreasing the received light quantity with an optical filter as shown above makes it possible to digitally grasp a time point when the beam receiver has come to a complete light-reception state, it becomes practicable to achieve an accurate optical-axis adjustment.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
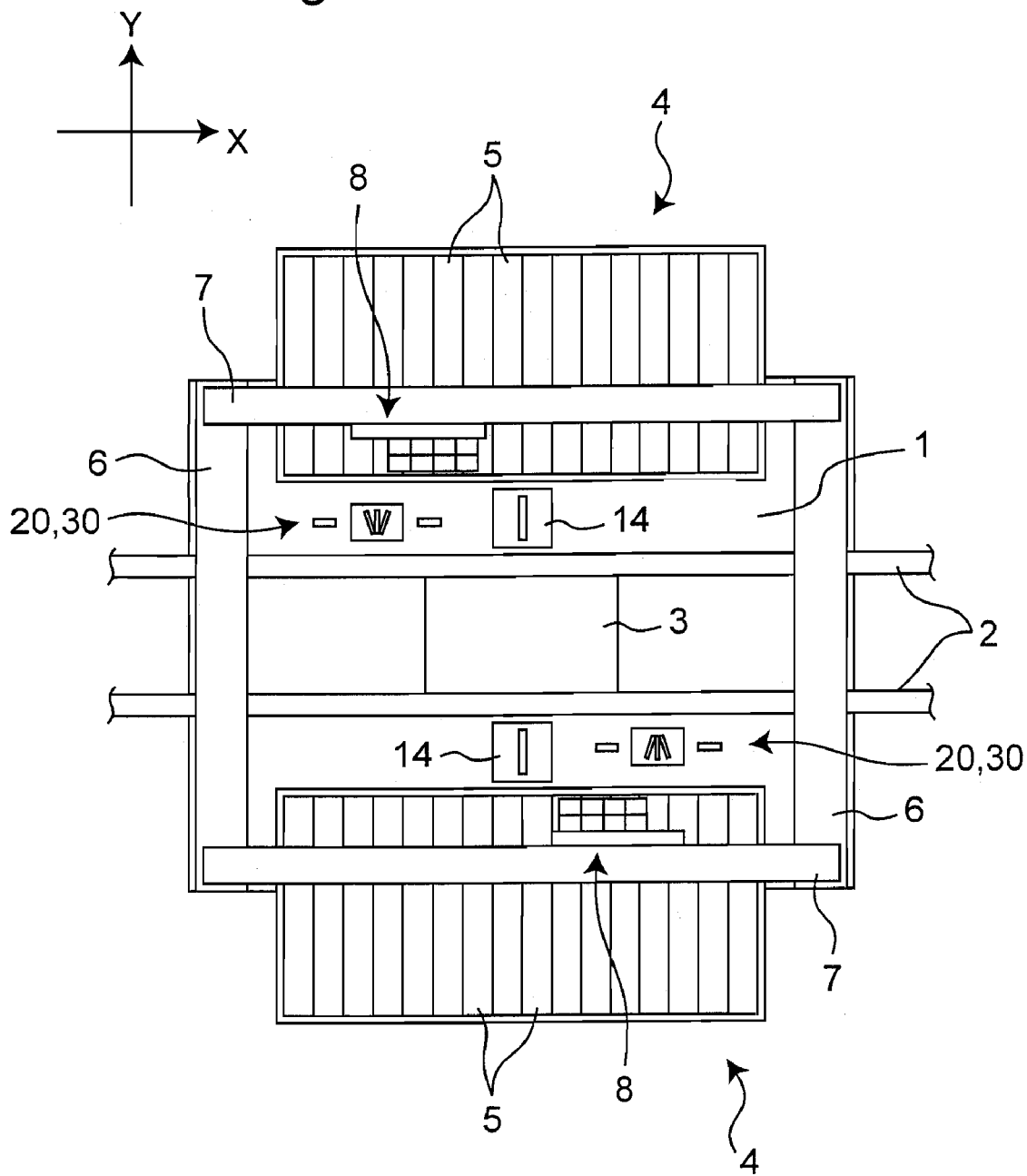
FIG. 1 is a schematic plan view of an electronic component mounting apparatus according to a first embodiment of the present invention.

Before the description of the present invention proceeds, it is to be noted that like parts are designated by like reference numerals throughout the accompanying drawings.

Hereinbelow, one embodiment of the present invention is described in detail with reference to the accompanying drawings.

First Embodiment

General construction of an electronic component mounting apparatus according to a first embodiment of the present invention is described with reference to a schematic plan view of an electronic component mounting apparatus 100 shown in FIG. 1. As shown in FIG. 1, a conveyance guide 2 is placed at a generally center on a base 1. The conveyance guide 2 is an example of a board conveyance and positioning unit for conveying a board (circuit board) 3 as a mounting object, onto which an electronic component is to be mounted, and positioning the board to a specified position on the base 1. In this first embodiment, it is assumed that the conveyance direction of the board 3 is an X direction and a direction orthogonal to that within a horizontal plane is a Y direction.

Also, as shown in FIG. 1, component feed units 4 are placed on both sides of the conveyance guide 2 in the Y direction, and a plurality of tape feeders 5 are removably provided in arrays. A pair of Y tables 6 is placed at both end portions of the base 1 in the X direction. X tables 7 are installed so as to bridge over these Y tables 6, respectively, and moved in the Y direction by drive of the Y tables 6. Transfer heads 8 which are component mounting heads, are placed beside the X tables 7 and moved in the X direction by drive of the X tables 7, respectively. The Y tables 6 and the X tables 7 are examples of a horizontal moving unit for horizontally moving the transfer heads 8 in the X direction and the Y direction above the base 1.

Figure 2A:
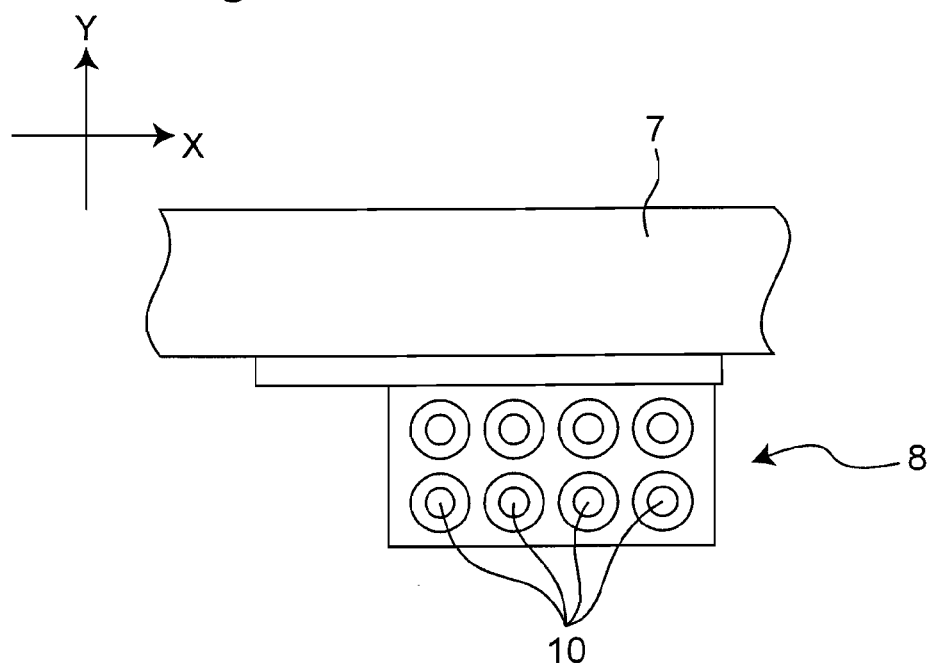
FIG. 2A is a schematic plan view of a transfer head included in the electronic component mounting apparatus of the first embodiment.
Figure 2B:
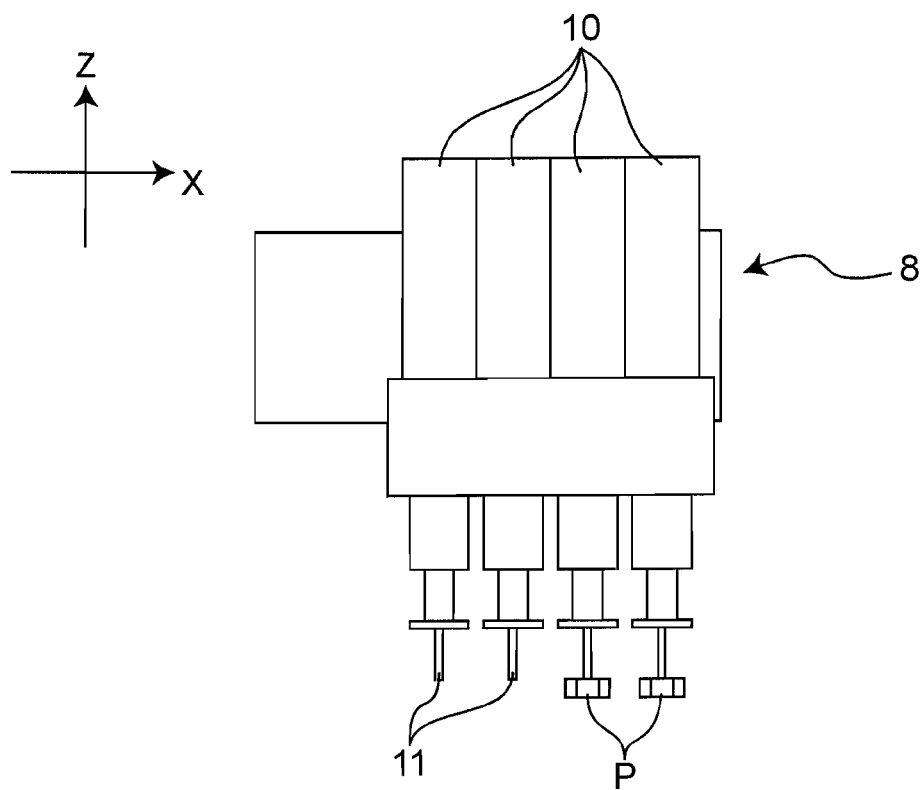
FIG. 2B is a schematic side view of the transfer head of the first embodiment.

FIG. 2A shows a schematic plan view of the transfer heads 8 included in the electronic component mounting apparatus 100, and FIG. 2B shows a side view of the same. As shown in FIGS. 2A and 2B, a plurality of nozzle units 10 are arrayed in the transfer heads 8, respectively. In this first embodiment, two nozzle unit rows in each of which four nozzle units are arranged in the X direction are arrayed in the Y direction. Also, as shown in FIG. 2B, nozzles 11 which are an example of the component holding member for releasably sucking and holding components P, that are electronic components, are fitted at lower end portions of the nozzle units 10, respectively. Each of the nozzle units 10 has a Z-axis drive unit 12 in which an example of an up/down unit for moving up and down the nozzle 11, and a θ-axis drive unit 13 for rotating the nozzle 11 (see FIG. 7). By up/down and rotational operations of the nozzle 11, suck-up posture of the component P sucked by the nozzle 11 can be corrected.

Referring to FIG. 1, a component recognition unit having a line camera 14 or the like is placed between the conveyance guide 2 and each component feed unit 4. This makes it possible to recognize the component P, which is sucked and picked up by the nozzle 11, from below by the line camera 14 or the like.

Thus, components fed from the tape feeders 5 are sucked and held, and picked up, to the nozzle 11 in a pickup position, and after correction of their suck-up posture recognized by the line camera 14, mounted onto the board 3. When components to be fed from the tape feeders 5 have exhausted up during the repetition of the mounting operation, the tape is replaced with a new one on which components of the same type are stored so that components are resupplied. Methods available for the replacement of the tape include a method of replacement with a whole tape reel on which a new tape is wound up, a method of replacement with a whole tape feeder, a method of joining and adding (splicing) a new tape, and the like. Tape replacement is performed by any one of those methods selected as required.

Referring to FIG. 1, a component-height detection use sensor unit 20, hereinafter, referred to as sensor unit 20, which is an example of the component height detection unit for detecting the height size of a component, as well as a component characteristic detection unit 30 for detecting electrical characteristics of the component, are integrally provided beside each line camera 14.

First, the construction of the sensor unit 20 is described with reference to the accompanying drawings. In conjunction with this description, FIG. 3A is a schematic structural view showing the structure of the sensor unit 20, FIG. 3B is a schematic side view showing a relationship between the orifice diameter of the sensor unit and a small component, and FIG. 3C is a schematic plan view similar to FIG. 3B.

Figure 3A:
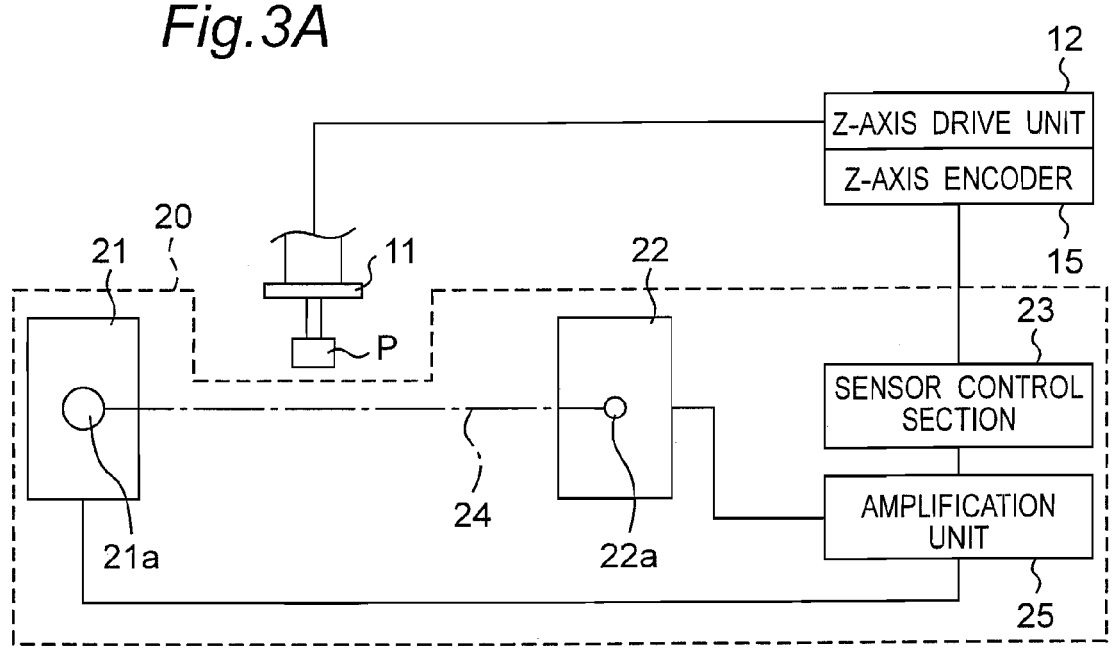
FIG. 3A is a schematic structural view of a sensor unit included in the electronic component mounting apparatus of the first embodiment.
Figure 9:
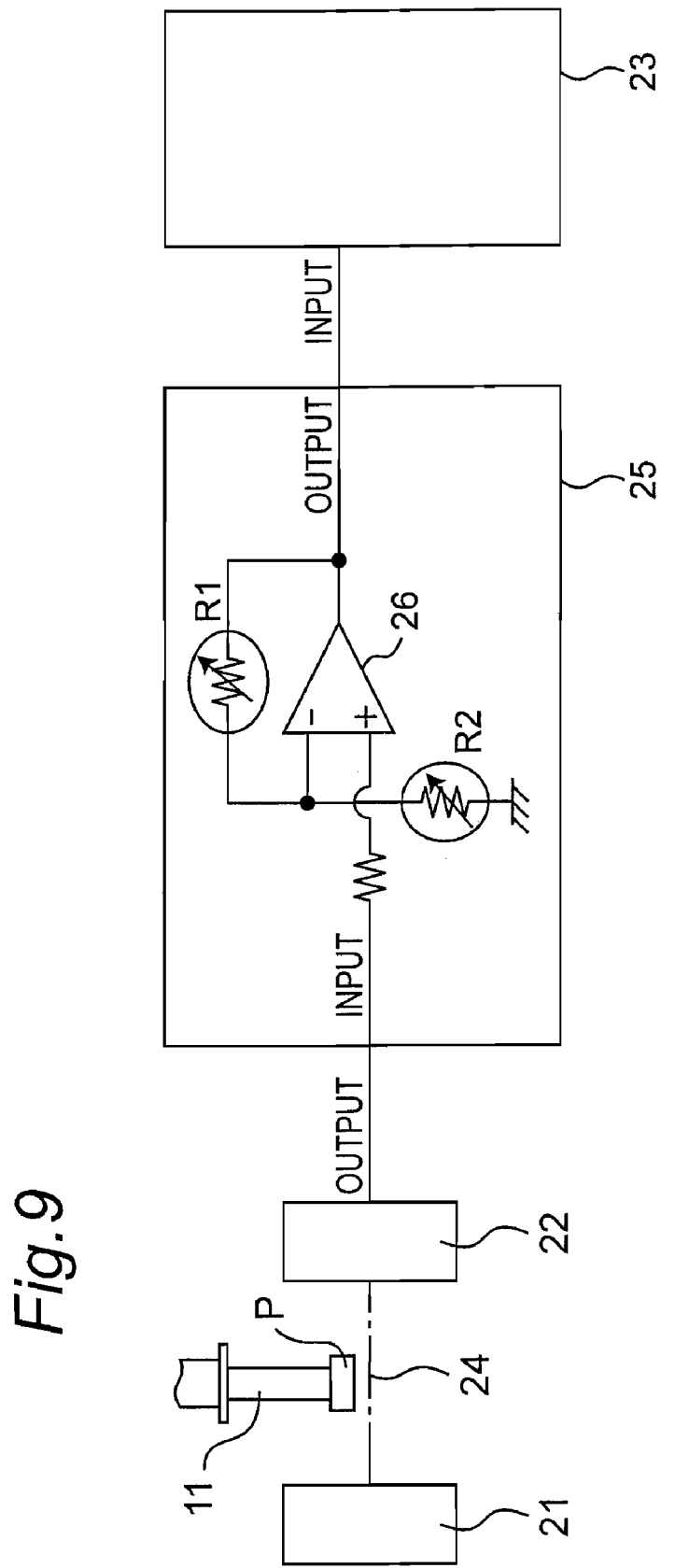
FIG. 9 is an electrical structural view of an amplification unit included in the sensor unit of the first embodiment.

Referring to FIG. 3A, the sensor unit 20 is made up as a photoelectric sensor which includes a beam projector 21, e.g., a laser light generation device, and a beam receiver 22 placed on an optical axis 24 so as to be opposed to and spaced from each other, a sensor control section 23 which is an example of the detection-device control unit electrically connected to the beam projector 21 and the beam receiver 22, and an amplification unit 25 which is an example of the light-reception-sensitivity setting unit. On opposing faces of the beam projector 21 and the beam receiver 22 are provided a projection-side orifice 21a and a reception-side orifice 22a, respectively. A laser beam, which is an, example of light beam projected (i.e., emitted) from the beam projector 21 via the projection-side orifice 21a along the generally horizontally placed optical axis 24, is received by the beam receiver 22 via the reception-side orifice 22a. The projection-side orifice 21a, which allows the laser beam emitted from the beam projector 21 to pass through its hole portion, has a function of narrowing the spot diameter of the laser beam so that the projection spot diameter of the laser beam becomes coincident with the hole diameter. Also, the reception-side orifice 22a, which allows the laser beam emitted from the beam projector 21 to pass through its hole portion, has a function of narrowing the spot diameter of the laser beam so that the reception spot diameter of the laser beam becomes coincident with the hole diameter. The received light quantity of the laser beam received by the beam receiver 22 is converted into voltage for management in processes, so that increments and decrements of the received light quantity are detected by increments and decrements of the voltage. The resulting voltage is amplified by the amplification unit 25 and outputted to the sensor control section 23, and an increment or decrement of the received light quantity is recognized in the sensor control section 23 based on an increment or decrement of the voltage. Further, the amplification unit 25 includes an operational amplifier 26 and a plurality of variable resistors. In this first embodiment, as shown in FIG. 9 two variable resistors R1, R2 are shown. By increasing or decreasing the resistance values of the variable resistors R1, R2, the degree of amplification of the received light quantity, which has been converted into voltage, is adjusted so that the light-reception sensitivity of the beam receiver 22 can be adjusted.

Figure 3B:
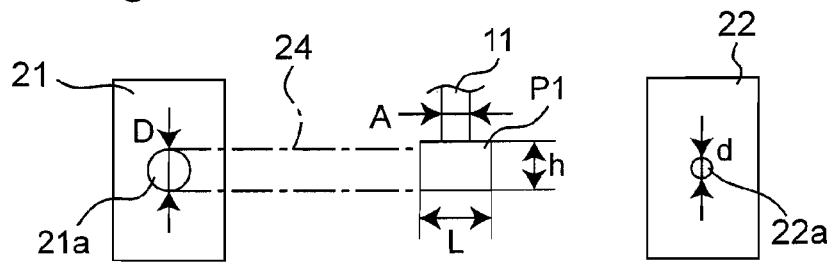
FIG. 3B is a schematic side view showing a relationship between the orifice diameter of the sensor unit of the first embodiment and a small component.
Figure 3C:
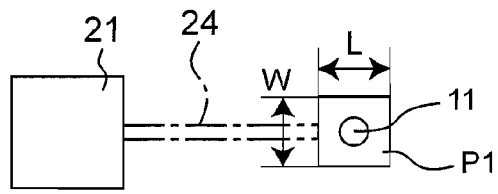
FIG. 3C is a schematic plan view showing a relationship between the orifice diameter of the sensor unit of the first embodiment and the small component.

Whereas the projection-side orifice 21a and the reception-side orifice 22a are provided so as to be opposed to each other on the optical axis 24, FIGS. 3A and 3B illustrate a state that surfaces on which the projection-side orifice 21a and the reception-side orifice 22a are provided are rotated by 90 degrees so as to face frontward, for an easier understanding of the description.

Figure 4A:
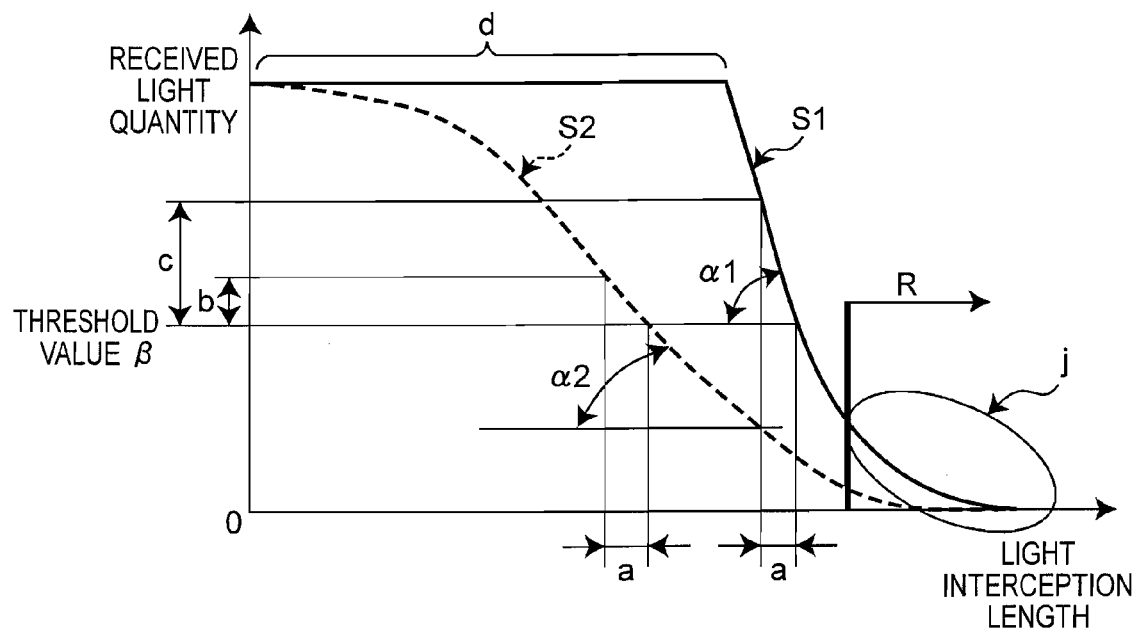
FIG. 4A is a graph showing a relationship between light-interception length and received light quantity in the sensor unit of the first embodiment.

Charted by solid line and broken line in FIG. 4A is a graph showing a relationship between light-interception length and received light quantity in the sensor unit 20. The broken line represents the relationship between light-interception length and received light quantity in a component-height-detection use photoelectric sensor according to a prior art, while the solid line represents a relationship between light-interception length and received light quantity in the sensor unit 20 of the first embodiment.

Now the principle of height detection for the component P, which is sucked and held by the nozzle 11, in the sensor unit 20 of the first embodiment, is explained by using a concrete operation method. After the component P fed from the tape feeder 5 of the component feed unit 4 is sucked and held by the nozzle 11, the transfer head 8 is moved to above the sensor unit 20. Thereafter, as the nozzle 11 is moved down, the sucked-and-held component P is moved down toward the optical axis 24 placed between the beam projector 21 and the beam receiver 22, by which the laser beam emitted along the optical axis 24 partly intercepted by the component P, where the component P intersects the optical axis 24 to intercept the laser beam. As the nozzle 11 is further moved down, the component P crosses the optical axis 24 to further intercept the laser beam, so that the length over which the laser beam is intercepted vertically, i.e. the light-interception length, increases, while the light quantity of the laser beam that reaches the beam receiver 22, i.e. the received light quantity, decreases. When a lower end of the component P and a lower end of the reception-side orifice 22a become flush with each other as a result of the down motion of the nozzle 11, the light-interception length reaches a complete light-interception region R (see FIG. 4A) where the light quantity of the laser beam that reaches the beam receiver 22, i.e. the received light quantity, becomes zero (actually, the received light quantity does not become zero because the laser beam is diffracted at end portions of the component P so as to be slightly received).

In the sensor unit 20, with a threshold value $\beta$ set for the received light quantity, the height of the component P is measured from both a height of the nozzle 11 at a time point when the received light quantity has reached the threshold value $\beta$ and a height of the nozzle 11 at a time point when the received light quantity has reached as a result of interception by the nozzle 11 that has not sucked the component P. It is noted that such a threshold value $\beta$ is an example of a light-decrease detection value of the received light quantity.

Referring to FIG. 3A, the sensor control section 23 is electrically connected to a Z-axis encoder 15. The Z-axis encoder 15 detects as an encoder value a drive amount by the Z-axis drive unit 12 that drives the up/down motions of the nozzle 11. When the received light quantity has reached the threshold value $\beta$, an ON signal is issued from the sensor control section 23 to the Z-axis encoder 15, where the then-current encoder value is obtained. Accordingly, the sensor unit 20 acquires an encoder value resulting when the received light quantity has come to the threshold value $\beta$ as a result of interception by the nozzle 11, and an encoder value resulting when the received light quantity has come to the threshold value $\beta$ as a result of the interception by the component P sucked by the nozzle 11. Then, the sensor unit 20 calculates an encoder value corresponding to the height of the component P from a difference between these encoder values, and calculates a height size of the component P from the correlation between known encoder values and heights. Thus, ON/OFF signals are transmitted between the sensor control section 23 and the Z-axis encoder 15, by which a height size of the component P is detected.

FIG. 3B shows a relationship in size among the component height of a small component P1 and the projection-side orifice 21a (i.e., hole portion in the orifice) and the reception-side orifice 22a (i.e., hole portion in the orifice). The small component P1 is one of the smallest among those to be treated in the mounting apparatus. If the component is a 0402-chip component as an example, it is about 0.4 mm long in longitudinal side length, about 0.2 mm long in lateral side length and about 0.2 mm thick in thickness, being smaller as compared with a projection/reception spot diameter of 1 mm of common projectors and beam receivers. Thus, when the small component P1 to intercept the laser beam is sized enough smaller than the spot diameter of the laser beam (e.g., as in the case of a conventional photoelectric sensor), it would be impossible for the small component P1 to intercept the laser beam in such a way that a decrement of the received light quantity can be clearly detected, with the result that such a correlation between light-interception length and received light quantity as shown in the chart of FIG. 4A could not be obtained. Thus, it would be hard to measure the component height of the small component P1.

With a view to solving such issues as could occur to conventional sensors as shown above, in the sensor unit 20 of the first embodiment, for measurement of the component height of such a small component P1, the reception-side orifice 22a having a diameter d smaller than a detection site of the small component P1 is provided the beam receiver 22 to narrow the light reception spot, as shown in FIG. 3B, so that the light-interception length is increased relative to the light reception spot so as to make the received light quantity decreased. It is noted that the term "detection site" refers to a portion of the small component P1 forming a surface that intercepts the laser beam, being a left-hand side face of the small component P1 formed of a height h and a width W of the small component P1 as viewed in the figure in the example of FIG. 3B. Accordingly, in the first embodiment, the reception-side orifice 22a is so set as to have a diameter d smaller than the height h of the small component P1. In consideration of such cases as a tip end of the nozzle 11 serves as the detection site, the diameter d of the reception-side orifice 22a is preferably so set as to be smaller than an outer diameter A of the nozzle 11.

By such formation of the reception-side orifice 22a in the beam receiver 22, even while the small component P1 is kept sucked and held by the nozzle 11, influences of the diffraction of the laser beam on light reception (influences of reflected light of the component side face on the light-interception width), which would occur due to the fact that the small component P1 is too small relative to the spot diameter of the laser beam, can be reduced. Accordingly, it becomes possible to maintain the correlation between received light quantity and light-interception length in the case where the laser beam is intercepted by the small component P1, so that detection accuracy can be enhanced by clearly detecting decreases in the received light quantity.

Although the projection-side orifice 21a of the beam projector 21 is desirably set to as small a diameter as possible, yet too small a diameter would make it difficult to do the optical-axis adjustment. Therefore, it is preferable to form the projection-side orifice 21a to a diameter D slightly larger than the diameter d of the reception-side orifice 22a. For example, if the diameter D of the projection-side orifice 21a is set to about 0.3 mm and the diameter d of the reception-side orifice 22a is set to about 0.1 mm, influences of diffracted light can be suppressed to small ones and moreover the workability for optical-axis adjustment can be ensured. In addition, the distance between the beam projector 21 and the beam receiver 22 may be set, for example, to about 50 to 85 mm, but such a distance may be set to various values depending on the design of the apparatus.

Meanwhile, due to the arrangement that the reception-side orifice 22a having a relatively small diameter corresponding to the size of the small component P1 as shown above is provided in the beam receiver 22, there could arise a disadvantage that a so-called light quantity deficiency that the received light quantity in the beam receiver 22 decreases, so that changes in received light quantity due to light interception could no longer be clarified. In order to prevent occurrence of such disadvantages, in this first embodiment, the light-reception sensitivity of the beam receiver 22 is improved so that changes in received light quantity can clearly be detected. The light-reception sensitivity can be improved by changing the resistance value of a variable resistor 26 (see FIG. 9) contained in a beam receiver output voltage amplification circuit included in the amplification unit 25. Improved light-reception sensitivity allows the voltage outputted from the beam receiver 22 to the sensor control section 23 to be amplified, so that minute changes in received light quantity can be detected more clearly.

Charted by solid line in FIG. 4A is a graph showing a relationship between light-interception length and received light quantity in the sensor unit 20 of the first embodiment with its light-reception sensitivity improved. While the received light quantity does not decrease but keeps a saturation state immediately before the light-interception length over which a complete light-interception state stretches, furthered light interception beyond this state causes the received light quantity to abruptly decrease. As a result of this, a gradient $\alpha 1$ of the curve in the vicinity of the light-interception length, over which the complete light-interception state stretches, becomes an abrupt gradient. Meanwhile, a gradient $\alpha 2$ of the broken-line curve showing the relationship between light-interception length and received light quantity with the light-reception sensitivity unimproved like a conventional sensor becomes a gentle gradient.

Therefore, in the vicinity of the threshold value $\beta$, a variation of the received light quantity against a certain light-interception length 'a' with an improved light-reception sensitivity (indicated by 'c' in the figure) is larger than the conventional counterpart (indicated by 'b' in the figure). Thus, with an improved light-reception sensitivity, variations of the light-interception length can be suppressed to smaller ones upon occurrence of changes in the received light quantity caused by disturbances due to ambient temperature or other ambient environments. As a result of this, the height of the nozzle 11 resulting when the received light quantity has reached the threshold value $\beta$ can be detected without being affected by any disturbance as much as possible, so that an accurate measurement of the height of the small component P1 can be fulfilled.

Figure 4B:
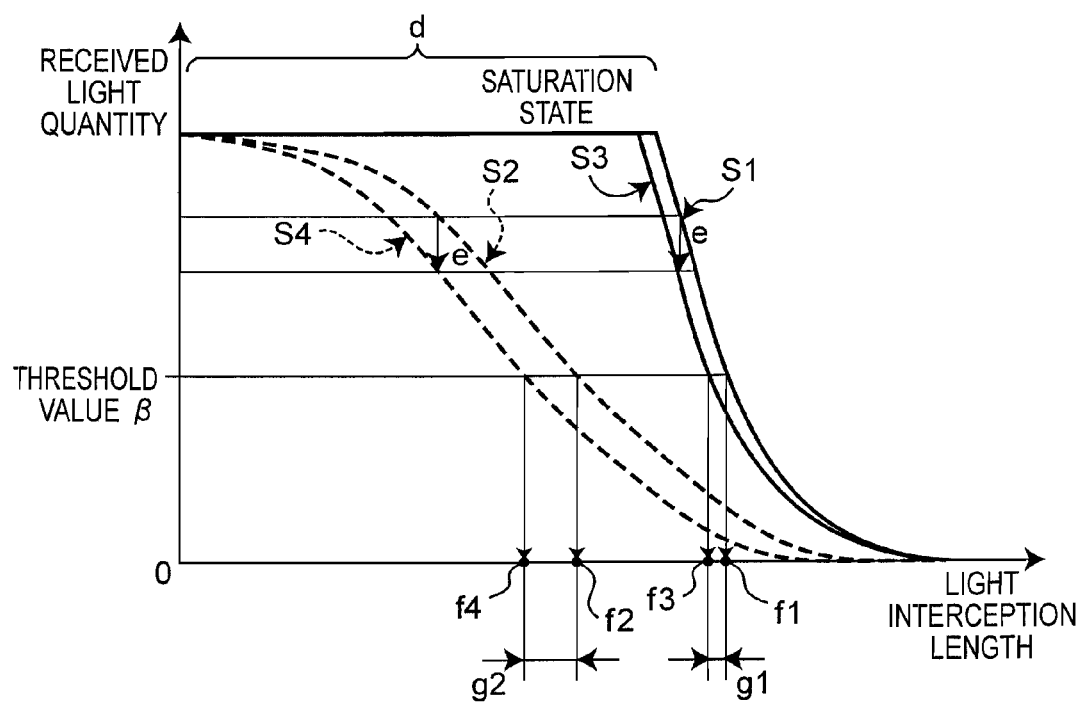
FIG. 4B is a graph showing a relationship between light-interception length and received light quantity upon occurrence of a decrease of light quantity in the graph of FIG. 4A.

More specifically, in FIG. 4B, the correlation between received light quantity and light-interception length is disturbed by a disturbance, where a solid-line curve S1 and a broken-line curve S2, showing a correlation in a normal state, have shifted downward each to an extent corresponding to the received light quantity 'e' so as to be changed into a correlation represented by a solid-line curve S3 and a broken-line curve S4, respectively. It is noted that the solid-line curve S3 shows a case where the light-reception sensitivity is improved while the broken-line curve S4 shows a case where the light-reception sensitivity is not improved.

In the solid-line curve S1 of FIG. 4B, the light-interception length at a time point when the received light quantity has reached the threshold value $\beta$ is f1. By contrast, in the solid-line curve S3 with the sensor characteristics changed by a disturbance, the light-interception length at a time point when the received light quantity has reached the threshold value $\beta$ is f3. In the broken-line curves S2, S4, similarly, the light-interception lengths are f2, f4, respectively. Since a difference g1 between the light-interception lengths f1 and f3 is smaller than a difference g2 between f2 and f4, a value closer to a true light-interception length is shown in the case where the light-reception sensitivity is improved, than where the light-reception sensitivity is not improved, even with occurrence of changes in sensor characteristics due to a disturbance. As a result of this, since variations of the height position of the nozzle 11 at a time point when the received light quantity reaches the threshold value $\beta$ can be suppressed to smaller ones even in the presence of various disturbances, it becomes possible to acquire stable encoder values on which influences of disturbances are suppressed, so that the height size of the small component P1 can be measured with high accuracy.

Furthermore, although the threshold value $\beta$ may be set to any arbitrary one, yet a region of received light quantity 'j' by diffraction should be avoided to avoid influences of light reception by diffraction, and a region where the received light quantity begins to decrease from the saturation state 'd' should also be avoided because of variations due to ambient environments. Accordingly, setting the threshold value $\beta$ to a region except those two regions 'j' and 'k' allows accurate measurement to be achieved, and besides setting the threshold value $\beta$ to a region 'c' where the gradient $\alpha 1$ of the solid-line curve at a generally mid portion of the two regions is generally constant is more preferable. With the diameter of the reception-side orifice 22a set to about 0.1 mm, the saturation state of the received light quantity is maintained to a light-interception length about half the length 0.1 mm, and the gradient $\alpha 1$ occurs in the subsequent light-interception length.

In this first embodiment, by improving the light-reception sensitivity of the beam receiver 22, as shown in the chart of FIG. 4A, the gradient $\alpha 2$ of the curve representing the correlation of the received light quantity with the threshold value $\beta$ set against light-interception length is shifted to the more inclined gradient $\alpha 1$, so that the received light quantity per unit light-interception length can be increased, by which trace amounts of changes in light-interception length are made detectable and the detection accuracy can be improved. In addition, improving the light-reception sensitivity can also eliminate the possibility of an 'undetectability for changes in light-interception length with the received light quantity narrowed by the orifice,' which could occur without the improvement of the light-reception sensitivity.

Moreover, for height detection of the small component P1, intercepting the laser beam by its longer side allows a more accurate detection to be achieved. With the 0402-chip component as an example, the detection accuracy can be improved by light interception of the optical axis 24 with its longitudinal side W (W=0.4 mm) more than with its lateral side L (L=0.2 mm). Accordingly, it is desirable that the nozzle 11 that has sucked up the small component P1 be rotated so as to be changed in direction for execution of the detection.

Figure 5:
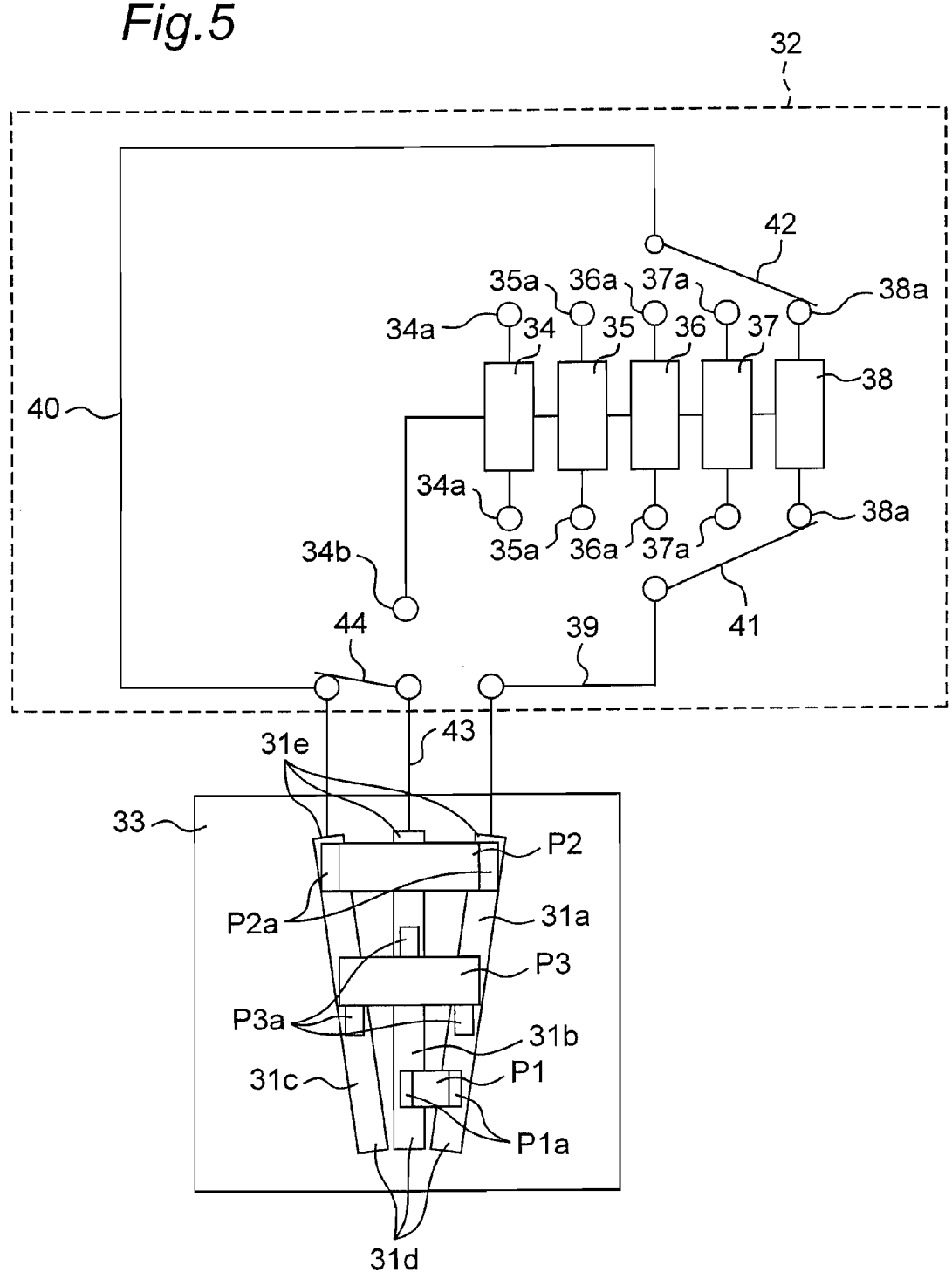
FIG. 5 is a schematic structural view of a component characteristic detection unit included in the electronic component mounting apparatus of the first embodiment.

Next, the component characteristic detection unit 30 is explained with reference to the schematic explanatory view of FIG. 5. Referring to FIG. 5, the component characteristic detection unit 30 includes three detectors 31a, 31b, 31c, and an electrical characteristic detection unit 32 to be electrically connected selectively to the three detectors 31a, 31b, 31c.

The individual detectors 31a, 31b, 31c are formed each from a highly electrically conductive thin plate of copper or the like in an elongated form and fitted on the top surface of a detection base 33. These three detectors 31a, 31b, 31c are so positioned that their longitudinal one end portions 31d are adjacent but contactless to one another while their spacings increasing toward their other end portions 31e.

Referring to FIG. 5, a small component P1 is placed at the end portions 31d of the detectors 31a, 31b, where electrodes P1a formed at both ends of the small component P1 are in contact with the detectors 31a, 31b, respectively. In the case where the small component P1 is the 0402-chip as an example, the spacing distance between the end portions 31d is about 0.2 mm. Meanwhile, a component P2 is placed on the end portions 31e of the detectors 31a, 31c, where electrodes P2a formed at both ends of the component P2 are in accurate contact with the detectors 31a, 31c, respectively. The component P2 is the largest component among those to be treated in the mounting apparatus, and the end portions 31e of the detectors 31a, 31c are spaced from each other at positions corresponding to the largest component P2. Also, a component P3 is a transistor, and three electrodes P3a are in contact with the detectors 31a, 31b, 31c, respectively.

With the use of the detectors 31a, 31b, 31c positioned in this way, any ones of those detectors can be brought into contact, as required, with electrodes of various components P to be treated in the electronic component mounting apparatus 100. In addition, in the case where transistors are not treated in the electronic component mounting apparatus 100, two detectors will do, where the central detector 31b may be omitted.

The electrical characteristic detection unit 32 is provided with a plurality of detection units for detecting electrical characteristics in correspondence to the types of the components P. For example, provided in the electrical characteristic detection unit 32 are a transistor polarity detection unit 34 for detecting polarity when the component P is a transistor, a diode polarity detection unit 35 for detecting polarity when the component P is a diode, an inductance detection unit 36 for detecting inductance when the component P is a coil component, an electrostatic capacitance detection unit 37 for detecting electrostatic capacitance when the component P is a capacitor, and a resistance value detection unit 38 for detecting resistance value when the component P is a resistor component.

The diode polarity detection unit 35 and the inductance detection unit 36, the electrostatic capacitance detection unit 37, and the resistance value detection unit 38 each have two terminals 35a, 36a, 37a, 38a. Also, the transistor polarity detection unit 34 has three terminals 34a, 34b. The detectors 31a, 31c are electrically connected to relays 41, 42 via cables 39, 40, respectively. The relays 41, 42 can be electrically connected selectively to the terminals 35a, 36a, 37a, 38a so that electrical characteristics corresponding to the types of the components P2 can be detected. Further, the detector 31b is electrically connected to a relay 44 via a cable 43. The relay 44 can be electrically connected selectively to the terminals 34b and the cables 39, 40. When the relay 44 is electrically connected to the cable 40, electrical characteristics of the component P1 can be detected. Besides, when the relay 44 is electrically connected to the cable 39, electrical characteristics of the component P1 can be detected also by the detectors 31b, 31c. Also, when the relay 44 is electrically connected to the terminal 34b and moreover the relays 41, 42 are electrically connected to the terminals 34a, transistor polarity of the component P3 can be detected.

Although FIG. 5 illustrates a state in which the three components P1, P2, P3 are placed on the detectors 31a, 31b, 31c for explanation's sake, yet only one component, which is an object to be detected, is placed for actual detection of electrical characteristics.

Figure 6A:
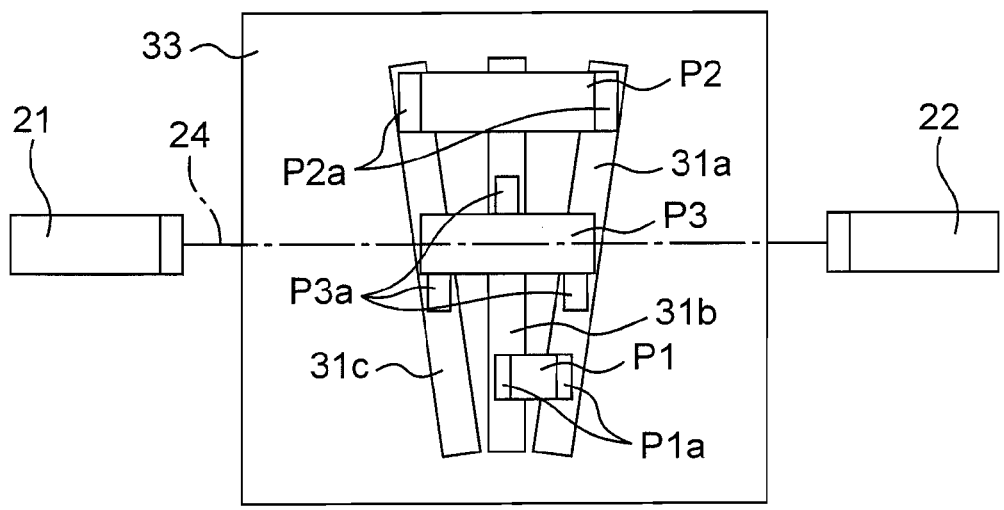
FIG. 6A is a schematic plan view showing layout of the sensor unit and the component characteristic detection unit of the first embodiment.
Figure 6B:
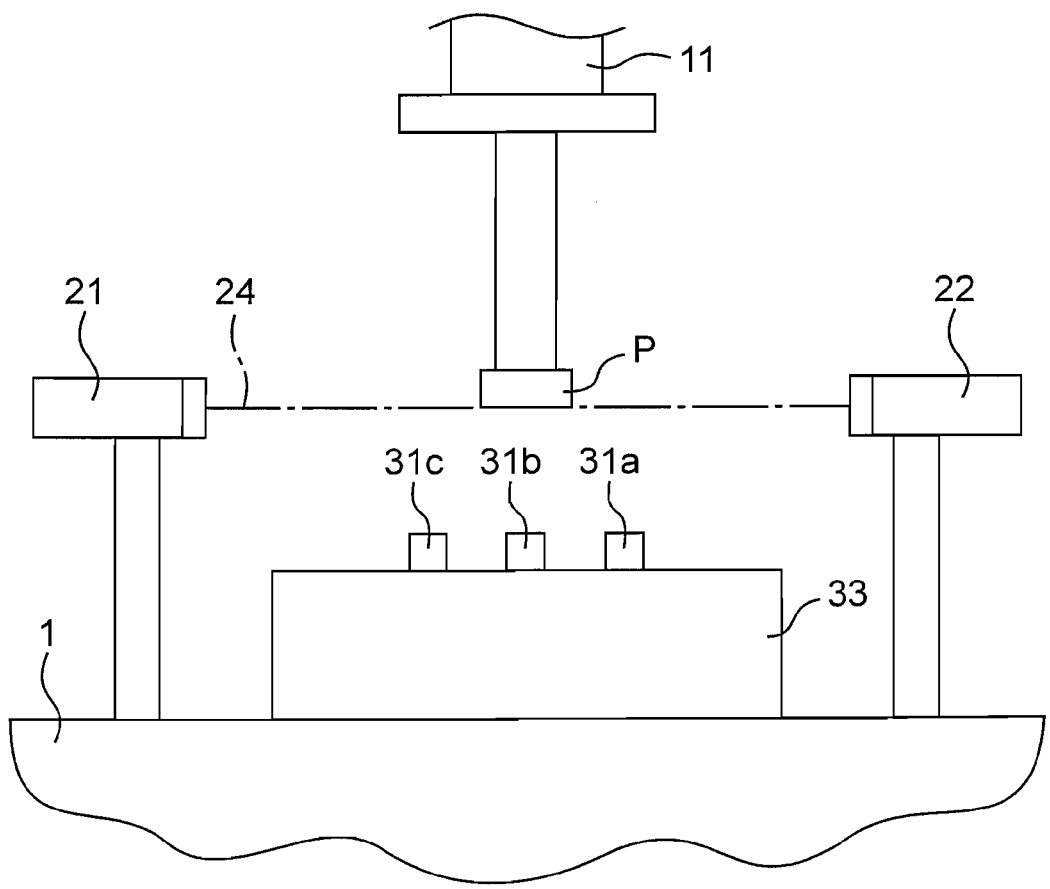
FIG. 6B is a schematic side view showing layout of the sensor unit and the component characteristic detection unit of FIG. 6A.

The beam projector 21 and the beam receiver 22 of the sensor unit 20 as well as the detection base 33 of the component characteristic detection unit 30, which are constructed as described above, can be integrally arranged on the base 1 of the electronic component mounting apparatus 100, for example, as shown in FIGS. 6A and 6B. With the beam projector 21 and the beam receiver 22 placed above both ends of the detection base 33, respectively, the component P sucked up to the nozzle 11 can be moved down so as to intersect the optical axis 24, where the component height is detected, and subsequently further moved down, as it is, so that the component P can be placed on the detectors 31a, 31b, 31c. Thus, the detection of component height and the detection of electrical characteristics can be executed in a sequence of operations, making it practicable to provide an electronic component mounting apparatus 100 of high efficiency and a high space-saving characteristic.

The component P, which has been placed on the detectors 31a, 31b, 31c and gone through the detection of electrical characteristics, is carried out to the succeeding step. Therefore, it is of efficiency that the detection operation for electrical characteristics is carried out as the component is kept sucked up to the nozzle 11. However, since the nozzle 11 is formed ordinarily from iron material or other electrically conductive material, it is desirable that for the detection, the suction is once canceled and the nozzle 11 and the component P are separated from each other to cut off the electrical conduction.

The detection of component height by the sensor unit 20 and the detection of electrical characteristic values by the component characteristic detection unit 30 are performed with the components P stored on the tape which is originally housed in the tape feeders 5 as well as with the components P stored on the tape which is to be replaced each time the components have exhausted. Detected component heights and electrical characteristic values are stored into a later-described data storage section 63.

Next, electrical and control structure of the electronic component mounting apparatus 100 are explained with reference to the control block diagram of FIG. 7. A control section 50 included in the electronic component mounting apparatus 100 is under electrical conduction with the conveyance guide 2, the tape feeders 5, the Y tables 6, the X tables 7, the Z-axis drive unit 12, the θ-axis drive unit 13, the line camera 14, the sensor unit 20 and the component characteristic detection unit 30 by means of a bus 51, where drive of these members can be controlled based on an NC program 54 by transmission and reception of control signals via the bus 51. The NC program 54 has previously been stored in a database section 52, where the database section 52 has also stored a component library 53, board data 55, nozzle data 56 and received-light-quantity threshold value data 57. The bus 51 may be provided in a wired or wireless form.

The data storage section 63 stores therein component height data detected in the sensor unit 20, component electrical characteristic value data detected in the electrical characteristic detection unit 32. The component height data is arithmetically processed in a data processing section 64 so that a height control quantity for the nozzle 11 is corrected based on a result of the processing. That is, a difference in component height before and after a tape replacement is calculated, where if the component height has changed before and after the tape replacement, the drive amount for the Z-axis drive unit 12 of the nozzle unit 10 is adjusted to correct the motion amount of the nozzle 11. If a component height after the tape replacement is larger than before, the down-motion amount of the nozzle 11 is decreased based on the component height difference so that the component sucked at the lower end of the nozzle 11 is prevented from being strongly pressed against the board and receiving an impulse. Conversely, if the component height after the tape replacement is smaller than before, the down-motion amount of the nozzle 11 is increased based on the component height difference so as to prevent such problems as bonding failures due to insufficient pressing force applied to the component sucked at the lower end of the nozzle 11.

The data processing section 64 serves both as a calculation means for calculating a component height difference before and after a tape replacement, and as a nozzle height control means for correcting the height control quantity for the nozzle 11 for use in the mounting of the replacement component based on a component height difference before and after a tape replacement. Thus, even when the component height has changed before and after a tape replacement, the replacement component can be mounted with just enough pressure, allowing mounting apparatus and mounting quality to be ensured.

Further, the data processing section 64 compares and collates electrical characteristic values of components before and after a tape replacement stored in the data storage section 63 to verify the identity of components before and after a tape replacement. Since permissible values for electrical characteristic values on the component type basis have previously been stored in the component library 53, these permissible values are referenced for the verification of the identity of components. Thus, in the verification of the identity of components before and after a tape replacement, electrical characteristics of components are actually detected, and subjected to comparison and collation, allowing a correct judgment to be fulfilled. The component characteristic detection unit 30 and the data processing section 64 serve as collation means for verifying the identity of components before and after a tape replacement by a comparison of electrical characteristics of components before and after the tape replacement.

An operation/input section 65, which is an input means such as a keyboard or data drive, is used to manually control the operation of the mounting apparatus, or to enter data into the database section 52 beforehand. A display section 66, which is a liquid crystal panel or CRT or other display means, visibly displays various kinds of information or the like associated with operations of the mounting apparatus and the like.

Figure 8:
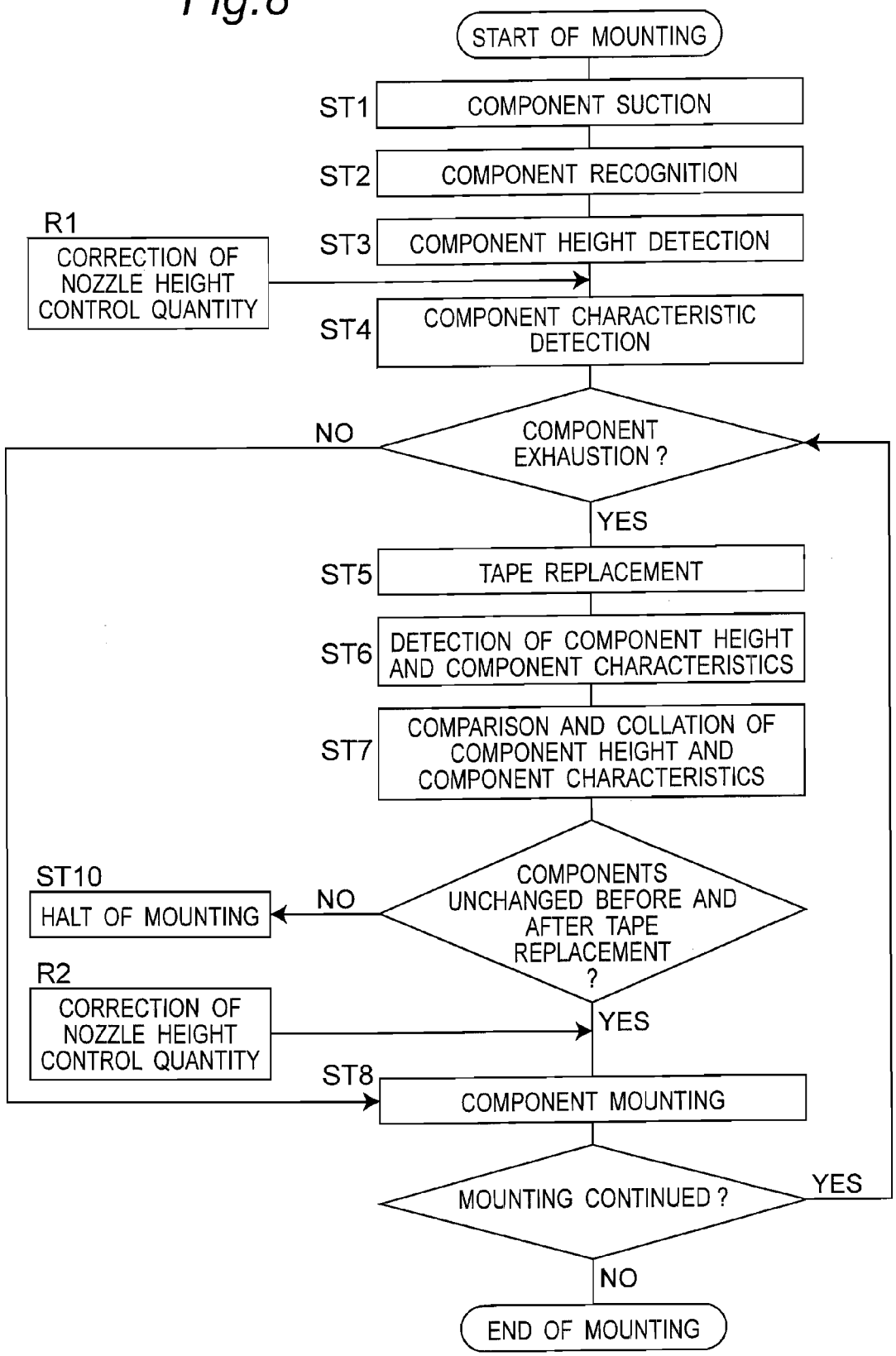
FIG. 8 is a flowchart showing mounting operation in the electronic component mounting apparatus of the first embodiment.

The electronic component mounting apparatus 100 of this first embodiment, which is constructed as described above, is next described with respect to its operation. In conjunction with the following description, a flowchart showing procedure of the mounting operation is shown in FIG. 8. It is noted that operational controls for individual constituent sections in the electronic component mounting apparatus 100 described below are executed as integrated control while associated with one another by the control section 50.

First, in FIG. 1, as the operation of the electronic component mounting apparatus 100 is started, the transfer head 8 including the nozzle 11 is moved to above a pickup position in the tape feeder 5. During this operation, the tape feeder 5 also starts its drive to feed the tape, on which a component P is stored, in pitches to the pickup position. At the pickup position, the nozzle 11 is moved down to suck up and hold the component P stored on the tape (step ST1). The nozzle 11, having sucked up the component P, is moved to above the line camera 14, recognizing the presence or absence of suck-up of the component P or its suck-up posture by the line camera 14 (step ST2). If the nozzle 11 is recognized as not having sucked up the component P, the mounting operation is not performed so as to avoid occurrence of a defective board. Also, if the component is not in a normal suck-up posture, the component is rotated by the drive of the θ-axis drive unit 13 so as to be corrected into a normal posture.

Next, component height size of the component P sucked up to the nozzle 11 is detected (step ST3). More specifically, as described above, the nozzle 11 that has sucked up the component P is positioned to above the sensor unit 20, and the component P is moved down along with the nozzle 11 so as to pass through the optical axis 24. During this down motion, a laser beam is emitted from the beam projector 21 toward the beam receiver 22 to detect a change in received light quantity of the beam receiver 22, by which the height size of the component P is detected. The detected component height is stored into the data storage section 63 and moreover reflected on the height control quantity for the nozzle 11 in component height detection (step ST4) of the succeeding step. That is, in order that lower faces of the electrodes are put into contact with top surfaces of the detectors with just enough pressure in the process that the electrodes of the component P, which has been sucked and held on the suction surface of the nozzle 11, into contact with the detectors, the height control quantity for the nozzle 11 is corrected in consideration of the component height, by which the down-motion amount of the nozzle 11 is adjusted (nozzle-height control quantity correction: R1). The detected component characteristics are stored into the data storage section 63.

When the components have exhausted in the component feed unit 4, the tape is replaced with another on which new components are stored (step ST5). Thereafter, the components stored on the replacement tape are subjected to the operations of steps ST1 to ST4 described above, by which component heights and component characteristics of the components after the tape replacement are detected (step ST6).

In comparison between the component heights and component characteristics of the components after the tape replacement detected in step ST6 and the component heights and component characteristics of the components before the tape replacement detected in steps ST3 and ST4, components before and after the tape replacement are collated (step ST7). If the components before and after the tape replacement have been ascertained to be identical to each other, the components stored on the replacement tape are mounted onto the board one by one (step ST8). In this step, if component height has changed before and after the tape replacement, a difference between the two components is reflected on the height control quantity for the nozzle 11 in the mounting of components after the tape replacement. That is, in order that the mounting surface of the component is pressed against the top surface of the board with just enough pressure in the process that the component, which has been sucked up to the suction surface of the nozzle 11, is mounted onto the board, the height control quantity for the nozzle 11 is corrected in consideration of the component height, by which the down-motion amount of the nozzle 11 is adjusted (nozzle-height control quantity correction: R2).

On the other hand, if the components before and after the tape replacement have not been ascertained to be identical to each other, the mounting operation is stopped (step ST10). As a result of this, occurrence of defective boards due to mismounting of incompatible components onto the board is prevented beforehand. It is noted that the component height detection operation (step ST3) and the component characteristic detection operation (step ST4) are performed once for components stored on the replacement tape each time the tape is replaced with another upon occurrence of component exhaustion in the component feed unit 4.

In the above description, the component height detection step (step ST3) and the component characteristic detection step (step ST4) are performed after the component recognition step (step ST2) by the line camera 14. However, for components that do not require the positioning accuracy between the component electrodes and the detectors, the component recognition step (step ST2) by the line camera 14 may be omitted.

Also, it has been described that the identity of components before and after the tape replacement is judged by collation of electrical characteristic values of the components. However, verification in consideration of both height size and electrical characteristics of components is desirable for an optimum mounting. The reason of this is that electronic components, even if they are electronic components of identical electrical characteristics made by identical manufacturers, subtly differ in their outer dimensions among production lots, the differences further increasing among individual manufacturers.

Further, the detection unit which serves as collation means for verifying the identity of components and which is provided in the electrical characteristic detection unit 32 is not limited to the above-described transistor polarity detection unit 34, the diode polarity detection unit 35, the inductance detection unit 36, the electrostatic capacitance detection unit 37 and the resistance value detection unit 38. A detection unit for detecting electrical characteristics corresponding to types of components co to be treated in the mounting apparatus may be further provided.

Also, the foregoing description has been made on a case where the tape feeder 5 is fitted to the component feed unit 4 as an example. However, the component feed unit in the present invention is not limited to this, and various forms of component feeders such as tray feeders or bulk feeders are also usable.

The term "orifice" ordinarily refers to a disc having a hole for narrowing the flow passage. However, the orifice needs only to have a function of narrowing the spot diameter by allowing a laser beam to pass therethrough, and so the term "orifice" in this first embodiment is used to stand for a member having a small hole portion that allows a laser beam to pass therethrough. Such a hole portion may be formed into any shape, for example, a round hole or a square hole. Accordingly, the diameter of the orifice is a concept that contains not only the diameter but also the height of the orifice in the vertical direction. It is noted that the term "an orifice" means a term "an orifice member" or "an orifice plate" having an orifice hole in this first embodiment. Furthermore, it can be said that such an orifice is "an aperture stop member" for limiting the spot diameter of the laser beam allowed to pass through.

Further, the foregoing embodiment has been described on a case where a laser beam is used as an example of the light beam. Otherwise, light beams outputted by using optical fiber (fiber output light) may also be used. A construction using optical fiber like this is applicable to cases where the distance between light projection unit and light reception unit is a relatively short one so that high detection accuracy is not required.

Figure 7:
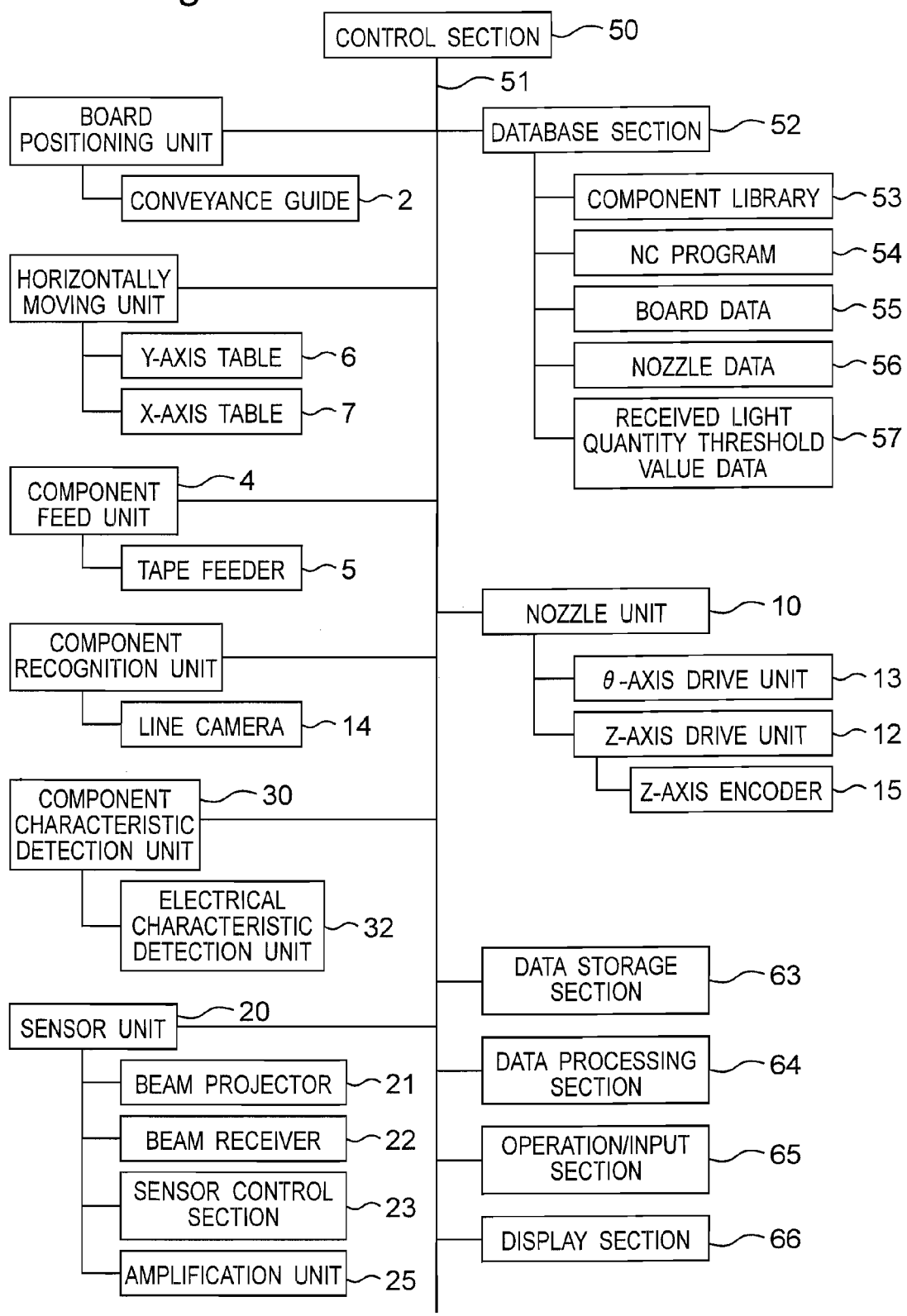
FIG. 7 is an electrical and control structural view in the electronic component mounting apparatus of the first embodiment.

Also, the received-light-quantity threshold value data 57, although having been shown as attached to the database section 52 in FIG. 7, may be attached to the sensor unit 20 to integrate detection unit functions together, in which case an efficient construction is made up.

Also, detected component height and electrical characteristic values may be stored also in an information storage section, such as identification tags, included in the tape feeder 5.

Figure 10:
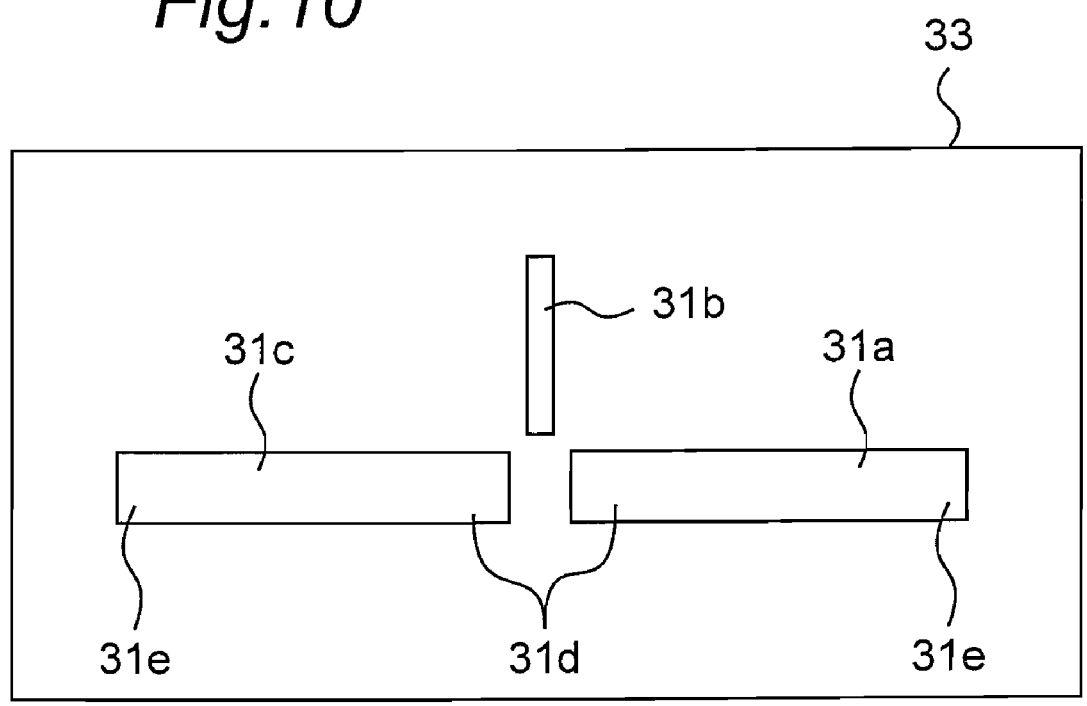
FIG. 10 is a schematic layout plan of a detector of the component characteristic detection unit according to a modification of the first embodiment.

Also, the detectors 31a, 31c shown in FIG. 5 are provided by adopting an arrangement structure in which they are slanted to each other with their one-side end portions closer to each other and their other-side end portions separate away from each other. Other than such an arrangement structure, the detectors 31a and 31b may also be arranged, for example, on a straight line as shown in FIG. 10.

Second Embodiment

The present invention is not limited to the foregoing first embodiment, and may be embodied in other various modes. For example, an electronic component mounting apparatus according to a second embodiment of the present invention, while including a sensor unit substantially similar in construction to the sensor unit 20 of the first embodiment, is intended to further improve the detection accuracy by detecting component height with a technique different from that of the first embodiment. Accordingly, in the following description, constituent members having the same construction as those of the sensor unit 20 of the first embodiment are designated by the same reference numerals and their description is omitted.

Figure 11:
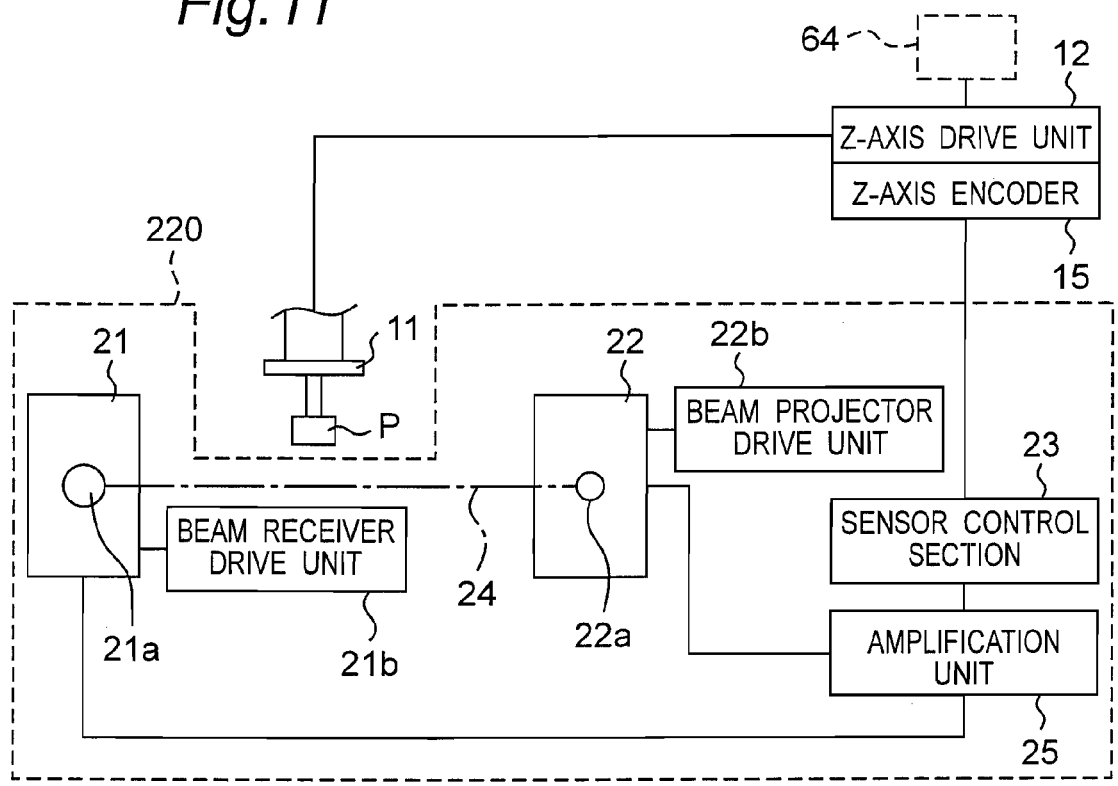
FIG. 11 is a schematic structural view of a sensor unit according to a second embodiment of the present invention.

First, a schematic structural view showing the structure of a sensor unit 220, which is an example of the component height detection unit included in the electronic component mounting apparatus of the second embodiment, is shown in FIG. 11. As shown in FIG. 11, the sensor unit 220, which includes the beam projector 21 with the projection-side orifice 21a and the beam receiver 22 with the reception-side orifice 22a, is so constructed as to emit a laser beam Q along the optical axis 24 placed between the beam projector 21 and the beam receiver 22. The construction is similar to that of the sensor unit 20 of the first embodiment.

In the sensor unit 220, the beam projector 21 and the beam receiver 22 include a projector drive unit 21b and a beam receiver drive unit 22b, respectively. By drive of these projector drive unit 21b and the beam receiver drive unit 22b, the beam projector 21 and the beam receiver 22 are moved and rotated vertically and horizontally, respectively, by which optical-axis adjustment for the beam projector 21 and the beam receiver 22 can be achieved.

The laser beam Q received by the beam receiver 22 is converted into voltage by a photoelectric element (not shown), amplified by the amplification unit 25, and outputted to the sensor control section 23. Accordingly, upon a change in the received light quantity due to interception of the laser beam Q, even if the amount of the change is a slight one, the change can clearly be detected as an amplified voltage change in the sensor control section 23.

It is noted that the projection-side orifice 21a and the reception-side orifice 22a are provided on opposing surfaces of the beam projector 21 and the beam receiver 22, respectively. However, FIG. 11 illustrates a state that surfaces, on which the projection-side orifice 21a and the reception-side orifice 22a are provided, are rotated by 90 degrees so as to face frontward, for an easier understanding of the description.

Referring to FIG. 11, the sensor control section 23 is electrically connected to the Z-axis encoder 15. The Z-axis encoder 15, which directly connects with the Z-axis drive unit 12, is enabled to detect as an encoder value in pulses a Z-axis displacement amount of the nozzle 11 that is moved up and down by the drive of the Z-axis drive unit 12.

Also, as the nozzle 11 is moved up and down between the beam projector 21 and the beam receiver 22 by the drive of the Z-axis drive unit 12, a lower end portion of the nozzle 11 and the electronic component P sucked up to the lower end portion of the nozzle 11 intersect the laser beam Q, by which the laser beam Q is intercepted, resulting in a change in the received light quantity of the beam receiver 22. When the received light quantity has reached a certain threshold value, an ON/OFF signal is issued from the sensor control section 23 to the Z-axis drive unit 12, where the then-current encoder value is acquired and transmitted to the data processing section 64.

Figure 12:
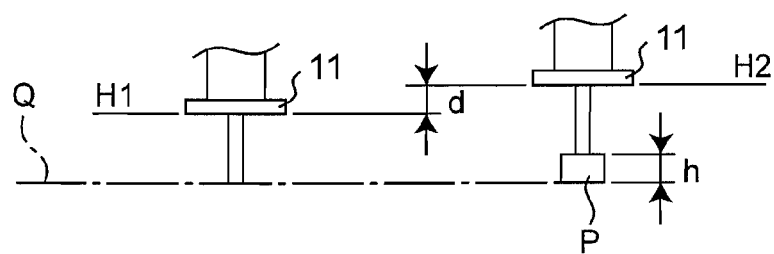
FIG. 12 is a schematic explanatory view of an electronic component height detection method by the sensor unit of the second embodiment.

In this connection, a schematic explanatory view for explaining a relationship of up/down height positions of the nozzle 11 between the nozzle 11 by which no component P is sucked and held and the nozzle 11 by which the component P has been sucked and held is shown in FIG. 12.

In FIG. 12, the nozzle 11 shown on the left side in the figure is located at a first height position H1 in its up/down motions, showing a time point when the lower end portion of the nozzle 11 with no component P sucked and held intersects the laser beam Q with the result that the received light quantity of the beam receiver 22 has reached a predetermined threshold value. Also, the nozzle 11 shown on the right side in the figure is located at a second height position H2, showing a time point when the component P sucked and held to the lower end portion of the nozzle 11 intersects the laser beam Q with the result that the received light quantity of the beam receiver has reached a predetermined threshold value. The first height position H1 and the second height position H2 of the nozzle 11 can be detected as encoder values by the Z-axis encoder 15, and from a difference between the two encoder values, a height 'h' of the component P can be measured by calculating a Z-axis displacement quantity "d" of the nozzle 11 corresponding to the height 'h' of the component P.

Thus, the Z-axis encoder 15 serves as an example of detection means which detects the first height position H1 of the nozzle 11 at a time point when the lower end portion of the nozzle 11 intersects the laser beam Q as a result of up/down motions of the nozzle 11 with the result that the received light quantity of the beam receiver 22 has reached a predetermined threshold value, and moreover which detects the second height position H2 of the nozzle 11 at a time point when the component P sucked and held by the lower end portion of the nozzle 11 intersects the laser beam Q as a result of up/down motions of the nozzle 11 with the result that the received light quantity of the beam receiver 22 has reached a predetermined threshold value. Further, the Z-axis drive unit 12 is an example of the up/down drive unit for moving up and down the nozzle 11 between the beam projector 21 and the beam receiver 22.

Figure 13A:
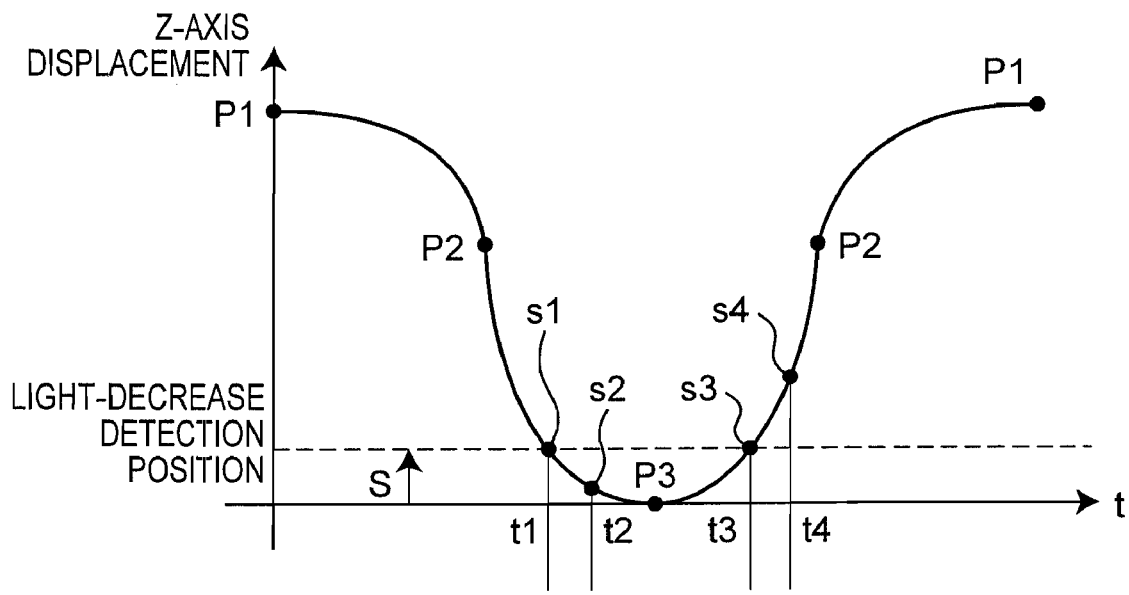
FIG. 13A is a graph showing a Z-axis displacement due to up/down motions of the nozzle in the component height detection method of the second embodiment.
Figure 13B:
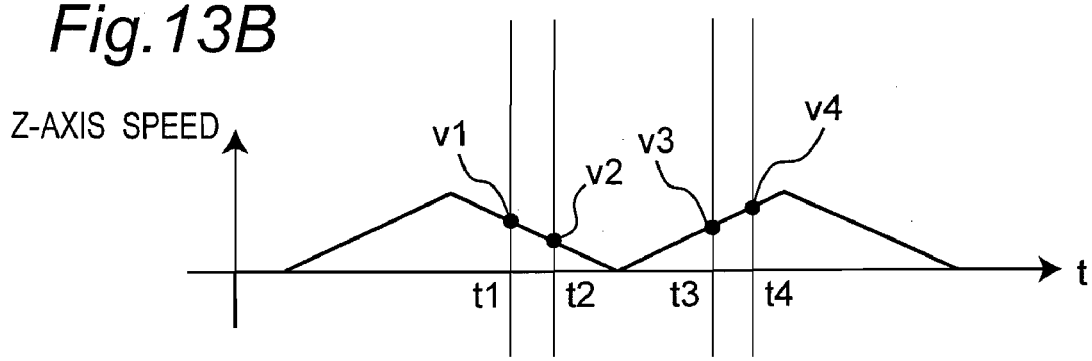
FIG. 13B is a graph showing Z-axis speed in up/down motions of the nozzle in the component height detection method of the second embodiment.

Next, the nozzle height detection method by the sensor unit 220 of this second embodiment is explained with reference to FIGS. 13A, 13B and 13C. FIGS. 13A and 13B show a relationship between Z-axis displacement and Z-axis speed of the nozzle 11 in a one-cycle up/down operation of the nozzle 11, where the vertical axes of the figures represent Z-axis displacement and Z-axis speed, respectively, and each horizontal axis represents time. The nozzle 11 moves down at an acceleration A from a top dead center P1 in its up/down height range, and upon reaching an inflection point P2 at a generally middle point of the up/down motions, moves down to a bottom dead center P3 while decelerating at the acceleration A. The nozzle 11, upon reaching the bottom dead center P3, moves up at the acceleration A, and upon reaching the inflection point P2, moves up to the top dead center P1 while decelerating at the acceleration A.

Figure 13C:
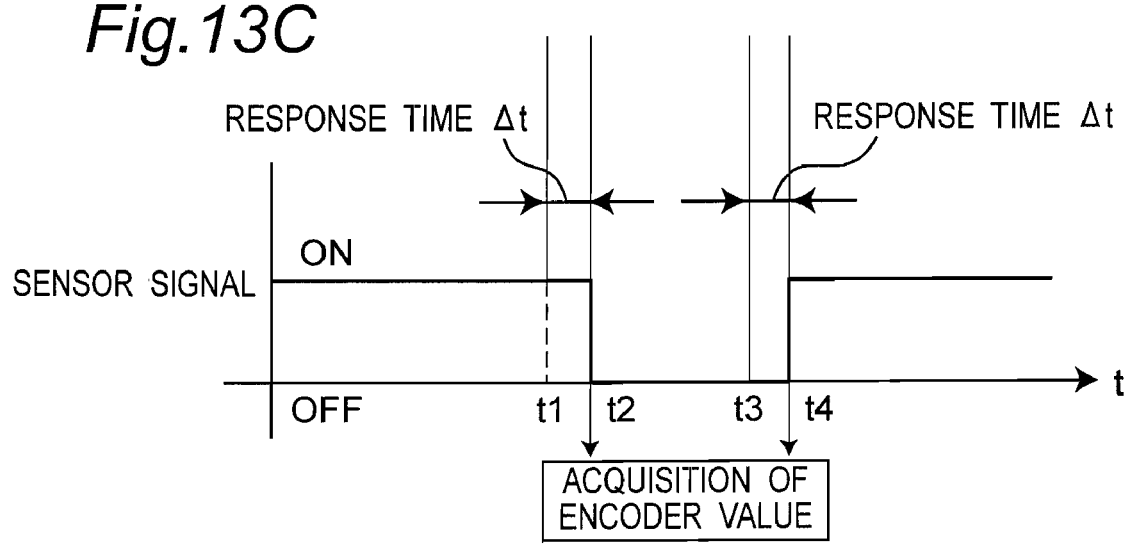
FIG. 13C is a schematic explanatory view showing the status of a signal issued from the sensor control section to the Z-axis encoder in the component height detection method of the second embodiment.

Referring to FIGS. 13A and 13C, when the nozzle 11 is positioned at light-decrease detection positions s1, s3 where it is detected by the sensor unit 220 that the received light quantity has reached the threshold value, an ON/OFF signal is issued from the sensor control section 23 to the Z-axis encoder 15. When this ON/OFF signal has reached the Z-axis encoder 15, the then-current encoder value is acquired. However, there arises a slight response delay, response time Δt, from when the ON/OFF signal is transmitted from the sensor control section 23 until when the encoder value is acquired in the Z-axis encoder 15. In FIG. 13C, simultaneously when the nozzle 11 in a down-motion state reaches the light-decrease detection position s1 at a time point of time t1, an OFF signal is transmitted from the sensor control section 23 to the Z-axis encoder 15, where an encoder value resulting at a time point of time t2 is acquired due to a response delay of response time Δt. Also, simultaneously when the nozzle 11 in an up-motion state reaches the light-decrease detection position s3 at a time point of time t3, an ON signal is transmitted from the sensor control section 23 to the Z-axis encoder 15, where an encoder value resulting at a time point of time t4 is acquired due to a response delay of response time Δt.

Due to this response delay, as shown in FIG. 13A, the actually acquired encoder value is, in the case of a down motion of the nozzle 11, an encoder value resulting not at a time point when the nozzle 11 is positioned at the light-decrease detection position s1 but at a time point when the nozzle 11 is positioned at s2 after a further down motion in an elapse of the response time Δt, and in the case of an up motion of the nozzle 11, an encoder value resulting not at a time point when the nozzle 11 is positioned at the light-decrease detection position s3 but at a time point when the nozzle 11 is positioned at s4 after a further up motion in an elapse of the response time Δt. Accordingly, measuring the height size of the electronic component P is measured by using an encoder value acquired in a down or up motion of the nozzle 11 as it is would involve an error due to the response delay. In order to prevent any decrease in detection accuracy due to occurrence of such errors, the component height detection method of this second embodiment adopts a technique that two encoder values acquired in down and up motions are averaged to calculate an approximate encoder corrected value Sc to thereby cancel the errors.

Next, the encoder corrected value Sc is explained by using calculated values. In the following calculations, each encoder value is expressed as a distance from the bottom dead center P3. Referring to FIGS. 13A and 13B, reference characters s1-s4 denote distances from the bottom dead center P3 of the nozzle 11, and v1-v4 denote speeds of the nozzle 11 at time points when the nozzle 11 pass through the s1-s4, respectively. Also, s1 and s3 are equidistant from the bottom dead center P3, and this equidistance is assumed as S.

Since $v2=v1-A\cdot\Delta t$, $v4=v3+A\cdot\Delta t$ and $v1=v3$, it follows that $v4=v1+A\cdot\Delta t$. It is noted that discrimination of the sign in the up/down direction of the nozzle 11 is not taken into consideration. Next, $s2=S-(v1+v2)\cdot\Delta t/2$, and $s4=S+(v3+v4)\cdot\Delta t/2$. Since encoder corrected value $Sc=(s2+s4)/2$, substituting the above equations into this results in that $Sc=S+(A\cdot\Delta t^2)/2$.

In this connection, in the electronic component mounting apparatus of this second embodiment, for example, since acceleration $A=2$ G $(=19.6$ m/s$^2)$ and response time $\Delta t=300$ µs, it follows that encoder corrected value $Sc=S+8.82\times10^{-7}$ m, with the result that an error from the true encoder value S is about 0.9 µm. Thus, the approximately calculated encoder corrected value Sc is extremely close to the true encoder value S. Furthermore, in calculation of s2 under the same conditions, since $s2=S-(v1+v2)\cdot\Delta t/2$, it follows that $s2=S-4.11\times10^{-5}$ m, the resulting error being 41.1 µm. In the case of small electronic components, for example, a 0603-chip component, which is sized to be 0.6 mm long, 0.3 mm wide and 0.3 mm high, errors measuring about 1/10 of the dimensions would have a large effect on the accuracy for the height detection of electronic components, which may lead to a possibility of mis-recognition of suck-up posture or the like. However, with the use of the above-described technique, sufficient reduction of errors becomes achievable, so that the component height detection accuracy can be improved.

The encoder corrected value Sc is calculated for each of the nozzle 11 having no component P sucked and held thereon and the nozzle 11 having the component P sucked and held thereon. That is, a first encoder corrected value Sc1 is calculated from an average of corrected values of first height positions H1 acquired in up and down motions of the nozzle 11 having no component P sucked and held thereon, and moreover a second encoder corrected value Sc2 is calculated from an average of corrected values of second height positions H2 acquired in up and down motions of the nozzle 11 having the component P sucked and held thereon. A Z-axis displacement amount 'd' of the nozzle 11 corresponding to the height h of the electronic component P is calculated from the first encoder corrected value Sc1 and the second encoder corrected value Sc2 calculated in the way described above, by which the height size h of the electronic component P can be detected (see FIG. 12).

Calculation of the first encoder corrected value Sc1 and the second encoder corrected value Sc2 as well as calculation of the height size h of the component P are performed in the data processing section 64 (see FIG. 7). The data processing section 64 is an example of first calculation means for calculating an average value of first height positions H1 of the nozzle 11 having no component P sucked and held thereon in its up and down motions, and for calculating an average value of second height positions H2 of the nozzle 11 having the component P sucked and held thereon in its up and down motions. The data processing section 64 is also an example of second calculation means for calculating a height size of the component P sucked and held at the lower end portion of the nozzle 11 from a difference between an average value of first height positions of the nozzle 11 and an average value of second height positions of the nozzle 11.

As shown above, in the component height detection of the electronic component mounting apparatus in this second embodiment, any shift of encoder values due to response delay of the sensor unit 220 is corrected with the use of approximate encoder corrected values calculated by averaging encoder values acquired in up and down motions of the nozzle, thus making it possible to detect the height size of the electronic component with high accuracy. Also, as a result of the use of encoder corrected values, it becomes unnecessary to set correction values for correction of shifts of the encoder values in correspondence to individual conditions such as the down-motion speed of the nozzle and the height size of the electronic component, and a similar technique can be applied also to electronic components of various specifications.

Next, mounting operation of the electronic component mounting apparatus is explained with reference to the flowchart shown in FIG. 14, primarily in terms of its component height detection operation. It is noted that operational controls for individual constituent sections shown in the flowchart of FIG. 14 are executed as integrated control while associated with one another by the control section 50, the sensor control section 23, the data processing section 64 or the like included in the electronic component mounting apparatus.

Figure 14:
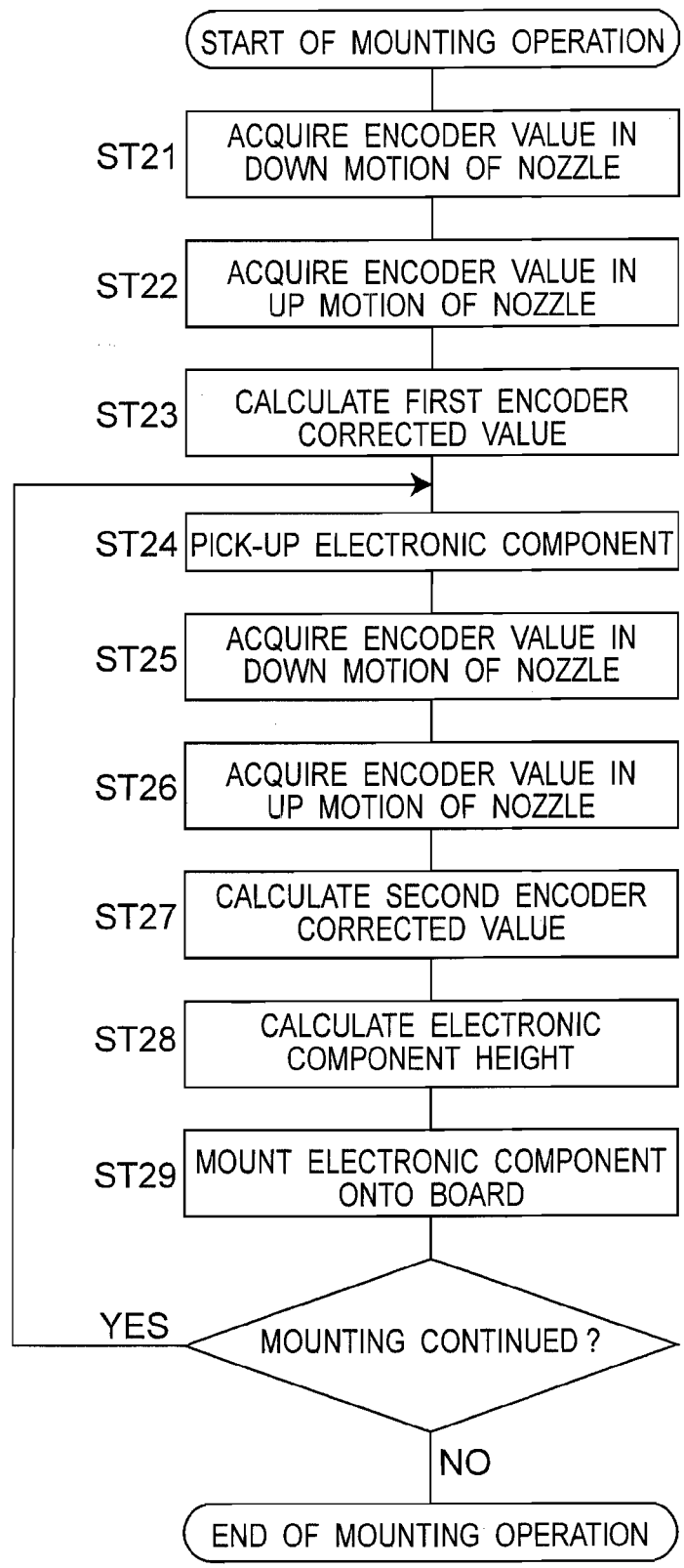
FIG. 14 is a flowchart showing mounting operation in the electronic component mounting apparatus of the second embodiment.

Referring to the flowchart of FIG. 14, upon a start of the mounting operation, at step ST21, the nozzle 11 is moved down so as to intersect the laser beam Q of the sensor unit 220 (first down-motion step), by which a down encoder value is acquired (first detection step). Next, at step ST22, the nozzle 11 that has been moved down at step ST21 is moved up so as to intersect the laser beam Q of the sensor unit 220 (first up-motion step), by which an up encoder value is acquired (second detection step). At step ST23, an average value of the down encoder value and the up encoder value acquired at step ST22 is calculated, by which a first encoder corrected value Sc1 is calculated (first calculation step).

Next, at step ST24, the nozzle 11 is moved to above the tape feeder (component feeder) 5, where the component P is sucked and held, and picked up. At step ST25, the nozzle 11 having the component P sucked and held at its lower end portion is moved down so as to intersect the laser beam Q of the sensor unit 220 (second down-motion step), by which a down-motion encoder value is acquired (third detection step). At step ST26, the nozzle 11 that has been moved down in step ST25 is moved up so as to intersect the laser beam Q of the sensor unit 220 (second up-motion step), by which an up-motion encoder value is acquired (fourth detection step). At step ST27, an average value of the down-motion encoder value and the up-motion encoder value acquired at step ST26 is calculated, by which a second encoder corrected value Sc2 is calculated (second calculation step). At step ST28, a difference between the first encoder corrected value Sc1 calculated at step ST23 and the second encoder corrected value Sc2 calculated at step ST27 is calculated, by which a height size of the component P is calculated (third calculation step). Thus, the height size of the component P sucked and held by the nozzle 11 is measured.

The calculated height size of the component P is collated with height data of various types of electronic components stored in the component library 53, a judgment as to any abnormal suction is made by making a judgment as to, for example, whether or not an electronic component of a specified type is sucked and held. Further, since there may be, in some cases, a difference in height even with the component P of a specified type normally sucked up, the difference is reflected on the nozzle height control quantity for the mounting of such an electronic component and the electronic component is pressed onto the board with a proper pressure so as to be mounted (step ST29). Thereafter, the operations of steps ST24-ST29 as described above are performed in continuation until the electronic components are completely mounted to all mounting places on the board, where the mounting operation is ended.

In addition, once the calculation of the first encoder corrected value Sc1 by the steps ST21-ST23 is performed one time for each one nozzle 11, then calculating its differences from the second encoder corrected values Sc2 on the basis of the type of the component P calculated at step ST27 allows the height of the component P to be measured.

In the foregoing description, with the sensor unit 220 placed on the base 1, the nozzle height is detected by moving the nozzle 11 to the sensor unit 220. However, in this second embodiment, the sensor unit 220 and the nozzle 11 have only to be moved relative to each other. For example, with the sensor unit 220 mounted on the transfer head 8 together with the nozzle 11, moving the sensor unit 220 to each nozzle 11 allows similar effects to be obtained. With such an arrangement, the height of the component P sucked to the nozzle 11 can be measured during the process that the transfer head 8 is moved between above the component feed unit 4 and above the board 3 by the conveyance guide 2 in order to pick up an electronic component and mount it onto the board 3. Thus, an improvement in the mounting efficiency becomes achievable.

Third Embodiment

Next, as a third embodiment of the invention, an optical-axis adjustment method for the sensor unit included in the electronic component mounting apparatus of the first or second embodiment is described below with reference to schematic explanatory views shown in FIGS. 15 and 16.

The optical-axis adjustment in such a sensor unit 20 (or sensor unit 220) is performed by adjusting the position or inclination of the beam projector 21 and the beam receiver 22 so as to provide a state that the laser beam Q projected generally horizontally from the beam projector 21 is perfectly received by the beam receiver 22, i.e., a state that the laser beam passes through the entire hole portion of the reception-side orifice 22a of the beam receiver 22 so that a laser beam of a specified light-reception spot diameter can be received by the beam receiver 22.

Figure 15:
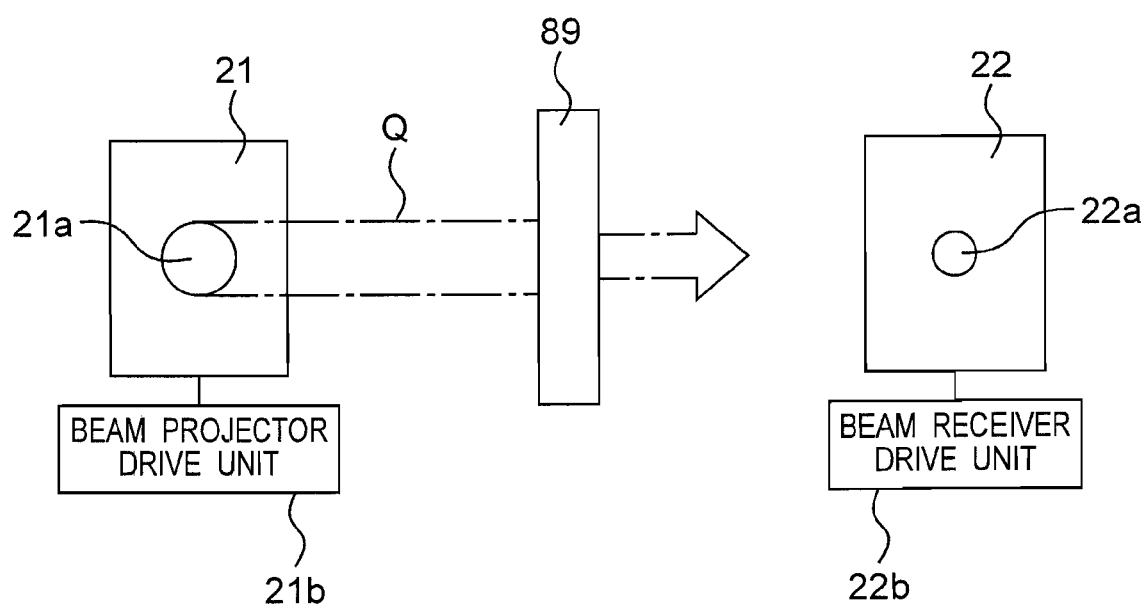
FIG. 15 is a schematic explanatory view showing an optical-axis adjustment method for the component height detection sensor unit in an electronic component mounting apparatus according to a third embodiment of the present invention.

More specifically, first, as shown in FIG. 15, an optical filter 89 is placed on an optical axis between the beam projector 21 and the beam receiver 22 so that the optical filter 89 intersects an emitted laser beam Q. The optical filter 89, which is an optical filter of low transmittancy, has a function of partly intercepting the laser beam Q projected from the beam projector 21 so as to decrease its light quantity to, for example, about one half. By the drive of the projector drive unit 21b and the beam receiver drive unit 22b, the beam projector 21 and the beam receiver 22 are moved, e.g. up and down, relative to each other, by which a center height of the projection-side orifice 21a and a center height are made horizontally aligned with each other. Also, the inclination of the beam projector 21 is so adjusted that the laser beam Q projected from the beam projector 21 becomes generally horizontal. Then, vertical and horizontal inclinations of the beam receiver 22 are so adjusted that the reception-side orifice 22a is securely positioned on the line of the laser beam Q.

Figure 16:
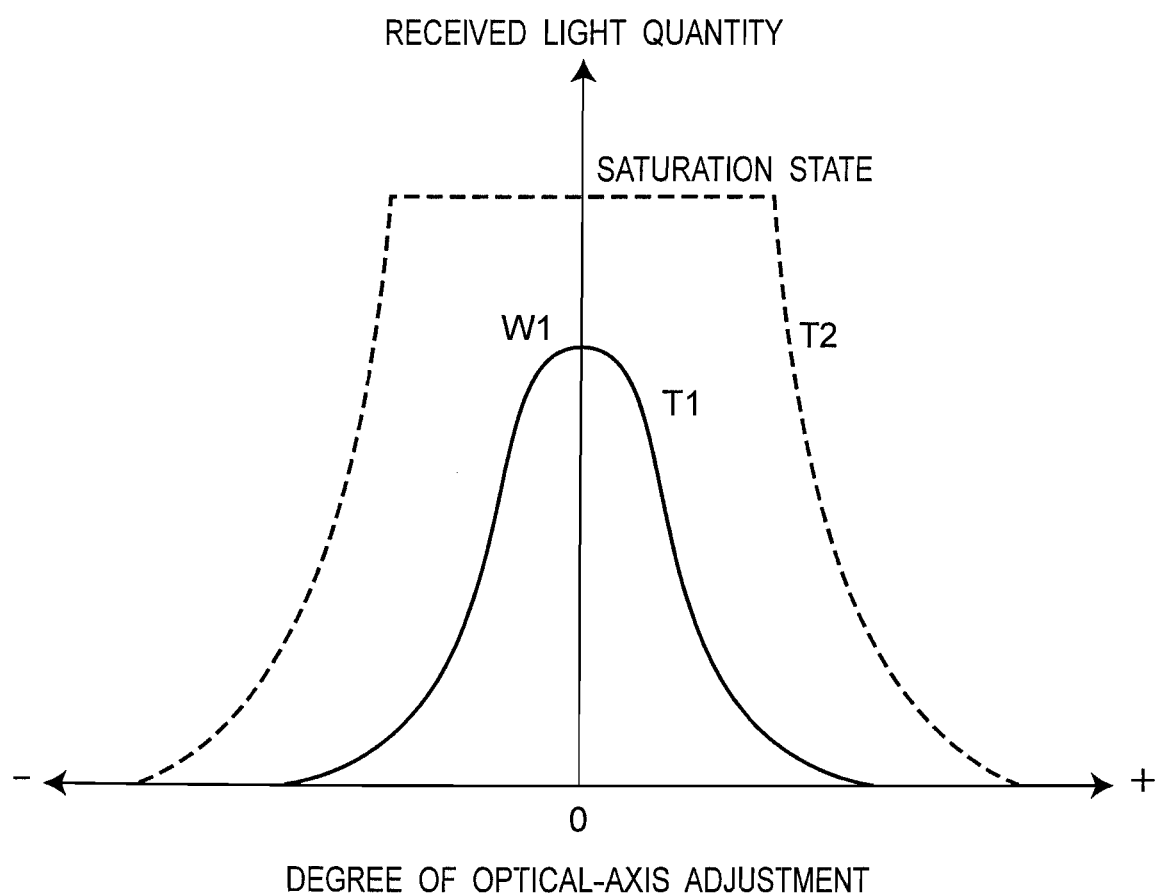
FIG. 16 is a graph showing a relationship between the degree of optical-axis adjustment and received light quantity in the sensor unit of the third embodiment.

Curves T1, T2 in FIG. 16 show relationships between the degree of optical-axis adjustment of the beam projector 21 or the beam receiver 22 and the received light quantity of the beam receiver 22. In FIG. 16, in which the horizontal axis represents the degree of optical-axis adjustment, the optical axis of the beam projector 21 and the optical axis of the beam receiver 22 coincide with each other when the degree of optical-axis adjustment is 0, and their optical axes shift from each other increasingly as the degree of optical-axis adjustment becomes farther from 0 toward the + or − side.

The solid-line curve T1 shows a relationship between the degree of optical-axis adjustment and the received light quantity in the case where the optical-axis adjustment is performed with the optical filter 89 interposed between the beam projector 21 and the beam receiver 22. The laser beam projected from the beam projector 21, passing through the optical filter 89, is reduced in its light quantity, so that the received light quantity in the beam receiver 22 becomes a perfect reception state when the degree of optical-axis adjustment is 0 (i.e., a state in which the optical axes of the beam projector and the beam receiver are perfectly coincident with each other), where the received light quantity W1 is at a maximum value. Accordingly, the optical-axis adjustment of the sensor unit 20 can be fulfilled by detecting a position of the reception-side orifice 22a resulting when the received light quantity comes to a maximum, based on the function of the sensor control section 23 (see FIG. 7) that numerically controls a change in the received light quantity of the beam receiver 22 resulting when the position of the reception-side orifice 22a is changed relative to the laser beam Q by the drive of the beam receiver drive unit 22b.

In contrast to this, the broken-line curve T2 in FIG. 16 shows a relationship between the degree of optical-axis adjustment and the received light quantity in the case where the optical filter 89 is not interposed. With the beam receiver 22 improved in light-reception sensitivity, even if the perfect light-reception state has not been reached, the received light quantity reaches a saturation value, hence a saturation state, so that it is impossible to detect a time point when the degree of optical-axis adjustment becomes 0 by making a numerical judgment as to the perfect light-reception state, making it becomes possible to fulfill an accurate optical-axis adjustment. Therefore, for optical-axis adjustment in the sensor unit 20 that has been improved in light-reception sensitivity, the light quantity to be received by the beam receiver 22 is decreased to, for example, about one half by the optical filter 89 which is interposed between the beam projector 21 and the beam receiver 22 so as to intersect the laser beam Q. Thus, the relationship between degree of optical-axis adjustment and received light quantity results in one represented by the solid-line curve T1, where the maximum received light quantity W1 becomes lower than that of the saturation state so as to be numerically graspable. This makes it implementable to clearly judge the time point at which the perfect light-reception state is reached.

As shown above, since the received light quantity is decreased with the low transmittancy filter interposed for the optical-axis adjustment of the component height detection sensor improved in light-reception sensitivity to accurately measure heights of small electronic components, it becomes practicable to perform the optical-axis adjustment in a state in which the light-reception sensitivity has been improved. Further, decreasing the received light quantity makes it possible to numerically grasp the time point when a perfect light-reception state is reached, so that an accurate optical-axis adjustment becomes achievable.

The optical filter shown above may be an optical filter for use of image pickup or the like, for example, an optical filter which is formed by using triacetylcellulose and black translucent and whose transmission factor (transmitted light quantity/total light quantity) is about 1/10.

Moreover, by the arrangement that the received light quantity W1 and the position of the reception-side orifice 22a at the time point when the perfect light-reception state is enhanced are stored in the sensor control section 23, the optical-axis adjustment for the next and following times becomes more easily achievable and, besides, errors among optical-axis adjustments can be eliminated so that variations in detection accuracy can be suppressed.

According to the present invention, the electronic component mounting apparatus has an advantage that height size of small components can be accurately detected by a component height detection unit formed with a relatively inexpensive photoelectric sensor or the like, thus being useful in the field of electronic component mounting that electronic components are picked up from the electronic component feed unit by nozzles and mounted onto a board or other mounting object.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosures of Japanese Patent Application No. 2005-199876 filed on Jul. 8, 2005, Japanese Patent Application No. 2005-245643 filed on Aug. 26, 2005, and Japanese Patent Application No. 2005-248976 filed on Aug. 30, 2005 including their specifications, claims, drawings, and summary are incorporated herein by reference in their entirety.

The invention claimed is:

1. An electronic component mounting apparatus for mounting an electronic component picked up by a component holding member from an electronic component feed unit onto a mounting object, comprising:
   a component height detection unit for detecting a height size of the electronic component held by the component holding member,
   the component height detection unit comprising:
      a beam projector for projecting a light beam along an optical axis;
      a beam receiver which is placed on the optical axis of the beam projector in opposition to the beam projector, for receiving the light beam projected from the beam projector;
      a projection-side orifice provided in the beam projector, for partly intercepting the light beam projected from the beam projector so that a projection spot diameter of the light beam is narrowed;
      a reception-side orifice provided in the beam receiver, for partly intercepting the light beam projected from the beam projector so that a reception spot diameter of the light beam received by the beam receiver is narrowed; and
      a light-reception-sensitivity setting unit for enhancing light-reception sensitivity of the beam receiver so as to compensate a quantity of light interception by the reception-side orifice in the beam receiver, wherein
   the electronic component held by the component holding member is placed on the optical axis between the beam projector and the beam receiver in the component height detection unit, a decrease of received light quantity of the light beam received by the beam receiver is detected by the component height detection unit, by which the height size of the electronic component is detected, and then based on the height size, the electronic component is mounted onto the mounting object.

2. The electronic component mounting apparatus as defined in claim 1, wherein
   the light-reception-sensitivity setting unit sets an enhanced light-reception sensitivity for the beam receiver so that a received light quantity of the beam receiver is substantially enhanced to a light quantity before the interception by the reception-side orifice.

3. The electronic component mounting apparatus as defined in claim 1, further comprising:
   a detection-device control unit for detecting that the received light quantity of the light beam received by the beam receiver has reached a light-decrease detection value to thereby detect the light decrease;
   an up/down drive unit for driving up and down moves of the component holding member; and
   a drive control unit for detecting an up/down height position of the component holding member moved-up or -down by the up/down drive unit, wherein
   the height position of the component holding member is acquired by the drive control unit at a time point when the light decrease is detected by the detection-device control unit, and the height size of the electronic component is calculated based on the acquired height position.

4. The electronic component mounting apparatus as defined in claim 3, wherein
   in the component height detection unit, a height size of the electronic component is calculated by a difference between the height position of the component holding member at which the light decrease is detected by the component holding member having no electronic component held thereon and the height position of the component holding member at which the light decrease is detected by the component holding member having the electronic component held thereon.

5. The electronic component mounting apparatus as defined in claim 1, wherein
   a hole diameter of the reception-side orifice is smaller than the height size of the electronic component.

6. The electronic component mounting apparatus as defined in claim 1, wherein
   a hole diameter of the projection-side orifice is larger than a hole diameter of the reception-side orifice.

7. The electronic component mounting apparatus as defined in claim 1, wherein
   the light-reception-sensitivity setting unit comprises at least an operational amplifier and a plurality of variable resistors, and
   the light-reception sensitivity of the beam receiver is improved and set by changing resistance values of the variable resistors.

8. The electronic component mounting apparatus as defined in claim 1, further comprising:
   an up/down drive unit for driving up and down moves of the component holding member; and detection means for, during the up/down motions of the component holding member by the up/down drive unit, detecting first height positions of the component holding member in an up motion and a down motion of the component holding member, respectively, the first height positions being height positions of the component holding member resulting at time points when a lower end portion of the component holding member intersects the light beam so that received light quantity of the beam receiver reaches a light-decrease detection value, and detecting second height positions of the component holding member in up and down motions of the component holding member, respectively, the second height positions being height positions of the component holding member resulting at time points when the electronic component held at the lower end portion of the component holding member intersects the light beam so that received light quantity of the beam receiver reaches the light-decrease detection value;

first calculation means for calculating an average value from the first height positions in the up and down motions of the component holding member and calculating an average value from the second height positions in the up and down motions; and second calculation means for calculating the height size of the electronic component based on a difference between the average value of the first height positions and the average value of the second height positions calculated by the first calculation means.

9. A method for detecting a height size of an electronic component by using the electronic component mounting apparatus as defined in claim 1, comprising:

a first detection step for, while moving down the component holding member, detecting, as a first height position of a down motion, a height position of the component holding member resulting at a time point when received light quantity of the beam receiver reaches a light-decrease detection value in a state that a lower end portion of the component holding member intersects the light beam;

a second detection step for, while moving up the component holding member, detecting, as a first height position of an up motion, a height position of the component holding member resulting at a time point when received light quantity of the beam receiver reaches the light-decrease detection value in a state that the lower end portion of the component holding member intersects the light beam;

a first calculation step for calculating an average value of the first height positions from the first height position of the down motion and the first height position of the up motion;

a third detection step for, while moving down the component holding member with the electronic component held on the lower end portion, detecting, as a second height position of a down motion, a height position of the component holding member resulting at a time point when received light quantity of the beam receiver reaches the light-decrease detection value in a state that the electronic component intersects the light beam;

a fourth detection step for, while moving up the component holding member with the electronic component held thereon, detecting, as a second height position of an up motion, a height position of the component holding member resulting at a time point when received light quantity of the beam receiver reaches the light-decrease detection value in a state that the electronic component intersects the light beam;

a second calculation step for calculating an average value of the second height positions from the second height position of the down motion and the second height position of the up motion; and a third calculation step for calculating a height size of the electronic component based on the average value oil of the first height positions and the average value of the second height positions.

10. A method for adjusting an optical axis between the beam projector and the beam receiver in the component height detection unit in the electronic component mounting apparatus as defined in claim 1, comprising:

placing an optical filter on the optical axis between the projection-side orifice of the beam projector and the reception-side orifice of the beam receiver; and adjusting a relative position between the beam projector and the beam receiver, thereby making an optical-axis adjustment, while the light beam projected from the beam projector is received by the beam receiver in a state that received light quantity of the light beam has been decreased through the optical filter.

11. The method for adjusting an optical axis in the component height detection unit as defined in claim 10, wherein the placement of the optical filter is implemented by placing on the optical axis an optical filter which has such a transmittancy that a received light quantity of the beam receiver in a perfect light-reception state with the optical filter provided becomes lower in value than a received light quantity of the beam receiver in a saturation state with no optical filter provided.

* * * * *

UNITED STATES PATENT AND TRADEMARK OFFICE
CERTIFICATE OF CORRECTION

PATENT NO. : 7,684,061 B2  Page 1 of 1
APPLICATION NO. : 11/994618
DATED : March 23, 2010
INVENTOR(S) : Masanori Hiyoshi et al.

It is certified that error appears in the above-identified patent and that said Letters Patent is hereby corrected as shown below:

In the Claims

In column 28, claim 9, line 26, "value oil of" should read --value of--.

Signed and Sealed this

Seventh Day of December, 2010

David J. Kappos
*Director of the United States Patent and Trademark Office*